United States Patent
Kato et al.

(10) Patent No.: US 9,204,586 B2
(45) Date of Patent: Dec. 1, 2015

(54) ELECTRONIC-CIRCUIT ASSEMBLING PROCESS

(75) Inventors: Daisuke Kato, Kuwana (JP); Hiroyuki Haneda, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 281 days.

(21) Appl. No.: 13/154,837

(22) Filed: Jun. 7, 2011

(65) Prior Publication Data

US 2011/0302776 A1 Dec. 15, 2011

(30) Foreign Application Priority Data

Jun. 10, 2010 (JP) .................................. 2010-133232

(51) Int. Cl.
*H05K 13/04* (2006.01)
*H05K 13/08* (2006.01)

(52) U.S. Cl.
CPC ............ *H05K 13/0452* (2013.01); *H05K 13/08* (2013.01); *Y10T 29/49124* (2015.01)

(58) Field of Classification Search
CPC ..... H05K 13/02; H05K 13/04; H05K 13/046; H05K 13/0452; H05K 3/341
USPC ..................... 29/832, 840; 700/900
See application file for complete search history.

(56) References Cited

U.S. PATENT DOCUMENTS 5,570,993 A * 11/1996 Onodera et al. ............... 414/783
6,718,629 B1 * 4/2004 Stanzl ............................. 29/832

(Continued)

FOREIGN PATENT DOCUMENTS

CN 1714611 A 12/2005
JP A-6-143669 5/1994

(Continued)

OTHER PUBLICATIONS

Feb. 25, 2014 Office Action issued in Japanese Patent Application No. 2010-133232 (with translation).

(Continued)

*Primary Examiner* — Carl Arbes
(74) *Attorney, Agent, or Firm* — Oliff PLC

(57) ABSTRACT

An electronic-circuit assembling process to be carried out in an electronic-circuit assembling system, for assembling an electronic circuit, by mounting electronic circuit components supplied from a component supplier, onto a circuit board, wherein the electronic circuit components includes at least one of different-property components having respective different electrical properties. The process includes: (a) a different-property-component-related information obtaining step of obtaining a different-property-component-related information including (a-i) a property-related information that enables recognition of the electrical property of the different-property component supplied from the component supplier and (a-ii) a different-property-component supply position that is a position of the component supplier supplying the different-property component, such that the different-property-component-related information is obtained by detecting the property-related information and/or the different-property-component supply position; (b) a mounting step of mounting, based on information related to the different-property-component supply position, the electronic circuit components including the different-property component, onto the circuit board; and (c) a property-related information providing step of providing the circuit board with the property-related information of the different-property component mounted on the circuit board.

16 Claims, 13 Drawing Sheets

(56) References Cited

U.S. PATENT DOCUMENTS

| | | | |
|---|---|---|---|
| 7,966,718 B2 * | 6/2011 | Kodama et al. | 29/739 |
| 2006/0085973 A1 * | 4/2006 | Kodama et al. | 29/740 |

FOREIGN PATENT DOCUMENTS

| | | |
|---|---|---|
| JP | A-10-229296 | 8/1998 |
| JP | A-11-87805 | 3/1999 |
| JP | A-2003-283199 | 10/2003 |
| JP | A-2004-104075 | 4/2004 |
| JP | A-2004-221518 | 5/2004 |
| JP | 2005136023 A * | 5/2005 |
| JP | A-2005-136023 | 5/2005 |
| JP | A-2006-261325 | 9/2006 |
| JP | A-2009-10319 | 1/2009 |
| JP | A-2011-35175 | 2/2011 |
| WO | 2009087872 A1 * | 7/2009 |
| WO | WO 2009/087872 A1 | 7/2009 |

OTHER PUBLICATIONS

Dec. 15, 2014 Office Action issued in Chinese Patent Application No. 201110162680.3.

Office Action mailed Sep. 24, 2014 in Japanese Patent Application No. 2010-133232 (with translation).

* cited by examiner

| SUBSTRATE-PIECE NUMBER | SEQUENCE NUMBER | COORDINATE | SLOT NUMBER |
|---|---|---|---|
| 1 | 1 | $X_1, Y_1, Q_1$ | $R_m$ |
| 1 | 2 | $X_2, Y_2, Q_2$ | $R_m$ |
| 1 | 3 | $X_3, Y_3, Q_3$ | $R_m$ |
| ⋮ | ⋮ | ⋮ | ⋮ |
| m | s-2 | $X_{s-2}, Y_{s-2}, Q_{s-2}$ | ⋮ |
| m | s-1 | $X_{s-1}, Y_{s-1}, Q_{s-1}$ | ⋮ |
| m | s | $X_z, Y_s, Q_s$ | ⋮ |

FIG.12

| SLOT NUMBER | COMPONENT NAME |
|---|---|
| 1 | ⋮ |
| 2 | ⋮ |
| 3 | ⋮ |
| ⋮ | ⋮ |
| $R_{m-2}$ | LED |
| $R_{m-1}$ | LED |
| $R_m$ | LED |
| ⋮ | ⋮ |

FIG.13

| MULTI-PIECE SUBSTRATE ID ||
|---|---|
| SUBSTRATE-PIECE NUMBER | BRIGHTNESS LEVEL |
| 1 | A |
| 2 | A |
| ⋮ | ⋮ |
| m-1 | A |
| m | B |
| ⋮ | ⋮ |
| M | B |

FIG.14

ELECTRONIC-CIRCUIT ASSEMBLING PROCESS

CROSS REFERENCE TO RELATED APPLICATION

This application claims priority from Japanese Patent Application No. 2010-138232 filed on Jun. 10, 2010, the disclosure of which is herein incorporated by reference in its entirety.

BACKGROUND OF THE INVENTION

1. Field of the Invention

The present invention relates to a process and a system for assembling an electronic circuit by mounting electronic circuit components onto a circuit board.

2. Discussion of Related Art

As disclosed in JP2003-283199A, there is known a technique for providing a circuit board with information representing electrical characteristics or properties of electronic circuit components that are mounted on the circuit board. This publication of the Japanese Patent Application discloses an electronic-circuit assembling system including two electronic-circuit-component mounters each of which is configured to mount a corresponding one of two kinds of electronic circuit components, onto the circuit board, so that the mounted electronic circuit components constitute an electric circuit formed on the circuit board. In this electronic-circuit assembling system, one of the two kinds of electronic circuit components are mounted on the circuit board by a corresponding one of the two electronic-circuit-component mounters, and then the other of the two kinds of electronic circuit components are mounted on the circuit board by the other of the two electronic-circuit-component mounters. In the above-described one of the two electronic-circuit-component mounters (which is configured to carry out the mounting operations prior to the mounting operations that are to be carried out by the other of the two electronic-circuit-component mounters), bar codes indicative of some information are printed onto the circuit board. This information indicated by the bar codes is information obtained from a database, and specifies ones of the electronic circuit components (of the other of the two kinds), which are to be associated with ones of the electronic circuit components (of the one of the two kinds) mounted by the one of the two electronic-circuit-component mounters, for providing the circuit board with a desired performance. Thereafter, in the above-described other of the two electronic-circuit-component mounters (which is configured to carry out the mounting operations after the mounting operations that have been carried out by the one of the two electronic-circuit-component mounters), the information indicated by the printed barcode is read out by the barcode reader, and the above-described ones of the electronic circuit components (of the other of the two kinds) specified by the information of the bar codes are mounted onto the circuit board, for thereby preventing an undesirable association of two electronic circuit components which does not guarantee the desired performance of the circuit board, namely, preventing such two electronic circuit components to be undesirably mounted in association with each other on the circuit board.

SUMMARY OF THE INVENTION

On the other hand, there is a need for making it possible to mount electronic circuit components, which have been supplied from a component supplying device via a component supply position, onto the circuit board and to provide the circuit board with information related to electrical property values of the mounted components, even where the electrical property values of the components and/or the component supply position are not predetermined. The present invention was made in the light of the background as described above, and an object of the invention is to provide an improved electronic-circuit assembling process and an improved electronic-circuit assembling system, which satisfy the above need.

This object may be achieved by an electronic-circuit assembling process which is to be carried out in an electronic-circuit assembling system, for assembling an electronic circuit, by mounting a plurality of electronic circuit components supplied from at least one component supplier of a component supplying device, onto a circuit board supported by a board supporting device, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling process including: (I) a different-property-component-related information obtaining step of obtaining a different-property-component-related information including (a) a property-related information that enables recognition of the electrical property of the at least one of the different-property components which is supplied from at least one of the at least one component supplier and (b) a different-property-component supply position that is a position of the at least one of the at least one component supplier supplying the at least one of the different-property components, such that the different-property-component-related information is obtained by detecting at least one of the property-related information and the different-property-component supply position; (II) a mounting step of mounting, based on at least information related to the different-property-component supply position obtained in the different-property-component-related information obtaining step, the plurality of electronic circuit components including the at least one of the different-property components, onto the circuit board; and (III) a property-related information providing step of providing the circuit board with the property-related information of the at least one of the different-property components which is mounted on the circuit board in the mounting step.

The phrase that "the different-property components can be handled as being components that are same as each other, in a control for controlling mounting of the components onto the circuit board" may be interpreted to mean that, even if there are configurational and/or dimensional differences between the components, the degree of the difference is within a tolerable range such that the components can be handled as being components that are the same as each other, in a case where a control is performed to merely control mounting of the component onto the circuit board. For example, in the component mounting operation, in general, after each component has been supplied from a component supplier to a component holder, an image of the component held by the component holder is taken by an component-image taking device, for carrying out various checks such as (i) judgment as to whether the component currently held by the component holder is a correct component and (ii) detection of an error of positioning of the component currently held by the component holder. The above phrase may be interpreted to mean that each of these checks can be carried out for the different-property components by using a same reference data common to the different-property components, namely, by comparing the detected data with the same common reference data, so that the different-property components can be handled as if it were the same components in the control performed to merely control mounting of the component onto the circuit board. It is noted that the phrase "the electrical properties of at least two of the different-property components are different from each other" may be interpreted to also mean that the electrical properties of the different-property components are of a plurality of different levels, i.e., are of at least two different levels.

In general, an electronic circuit component is expected to exhibit a function performance that is inherent to a kind of the electronic circuit component, and a degree of the functional performance varies depending on the electrical property of each electronic circuit component. There is a case where such a variation of the degree of functional performance is not ignorable. The electrical property value represents the degree of functional performance whose variation could be unignorable.

The property-related information may be either the electrical property value as such or information that enables recognition of the electrical property value.

The provision of the property-related information on the circuit board may be made in various manners such as printing of the information by a printing device, labeling of tape with description of the information, or writing of the information into an IC (integrated circuit) chip (e.g., tag chip) having an antenna. The property-related information, which is provided by the printing or tape labeling, may be represented by, for example, a barcode, two-dimensional code or other code easily readable by a device, or characters, numbers, signs, figures or any combination thereof All of the plurality of electronic circuit components may be the plurality of different-property components, or one or ones of the plurality of electronic circuit components may be the at least one of the different-property components. In the latter case, the plurality of electronic circuit components may include a non-different-property component or components such as a chip component (e.g., capacitor chip, resistor chip), a lead component (e.g., QFP (quad flat package)) having leads and a connector. Where the plurality of different-property components are to be mounted onto a single circuit board, the different-property components may be mounted together with each other onto a predetermined local area within the circuit board or may be mounted onto respective positions which are located on an entirety of the circuit board and which are distant from each other.

The property-related information may be provided either on a different-property component mount surface (i.e., a surface of the circuit board onto which the at least one of the different-property components is to be mounted) or on a surface opposite to the different-property component mount surface.

Where an electronic circuit is to be manufactured by mounting the plurality of electronic circuit components including the at least one of the different-property components, onto the circuit board, it is possible to increase a degree of freedom in operation carried out in an assembling workshop for assembling the electronic circuit, without predetermining at least one of the electrical property value and the component supply position of the at least one of the different-property components, namely, by allowing the at least one of the electrical property value and the component supply position to be determined in the assembling workshop. The increase of the degree of freedom in the operation in the assembling workshop makes it advantageously possible to perform the manufacturing of the electronic circuit in a manner satisfying limiting conditions that are likely to be required in the assembling workshop.

The present electronic-circuit assembling process was developed for the above-described advantage. Although the "different-property-component-related information obtaining step" may be implemented in a manner as described below, this step may be implemented in any other manner as long as the property-related information (that permits recognition of the electrical property value of the at least one of the different-property components) and/or the component supply position is obtainable by implementation of the this step. Even where at least one of the electrical property value and the component supply position is not predetermined and is unknown to the electronic-circuit assembling system, it is possible to mount the electronic circuit components onto the circuit board and to provide the circuit board with the information related to the electrical property value of the electronic circuit components (mounted onto the circuit board) in the electronic-circuit assembling system, because both of the electrical property value and the component supply position can become known to the electronic-circuit assembling system through implementation of the different-property-component-related information obtaining step, by determining the above-described at least one of the electrical property value and the component supply position in the assembling workshop and causing the determined at least one of the electrical property value and the component supply position to be detectable by the electronic-circuit assembling system. It is noted that "mounting the electronic circuit components onto the circuit board and providing the circuit board with the information related to the electrical property value of the mounted electronic circuit components" will be simply referred to as "assembling the electronic circuit" where appropriate.

For example, where the electrical property value of the at least one of the different-property components is predetermined so as to be already known to the electronic-circuit assembling system while the component supply position of the at least one of the different-property components is not yet known, it is possible to assemble the electronic circuit, by causing both of the electrical property value and the component supply position to become known in the electronic-circuit assembling system, through two manners, one of which is that the component supply position is detected by the electronic-circuit assembling system through an automatic detection of an install position in which the component supplier storing therein the different-property component (whose electrical property value is already known) is installed by an operator in the electronic-circuit assembling system, and the other of which is that the component supply position is detected by the electronic-circuit assembling system through a reception (i.e., detection) of information which is related to the install position and which is manually inputted by the operator. In the former case, for example, when storing the different-property component in the component supplier, the operator may input an identification-related information related to identification of the component supplier, into the electronic-circuit assembling system, so that the install position can be automatically detected by automatically determining that the identification-related information of the component supplier installed in an install position matches with the manually inputted identification-related information of the component supplier.

Further, where the component supply position of the at least one of the different-property components is predetermined so as to be already known to the electronic-circuit assembling system while the electrical property value of the at least one of the different-property components is not yet known, both of the electrical property value and the component supply position can become known in electronic-circuit assembling system, because it is possible to detect the electrical property value directly or via the identification-related information of the component supplier, by manually inputting the electrical property value per se of the different-property component into the electronic-circuit assembling system by the operator when the different-property component is stored in the component supplier by the operator, or by manually inputting a correlation between the identification-related information and the electrical property value of the component supplier, into the electronic-circuit assembling system by the operator when the different-property component is stored in the component supplier by the operator.

Where neither the electrical property value nor the component supply position is predetermined so as to be already known to the electronic-circuit assembling system, both of the electrical property value and the component supply position can be detected, for example, in a manner as described below.

It is noted that, in the present description, the "obtaining" of the property-related information of the different-property component and the "obtaining" of the supply position of the different-property component in the different-property-component-related information obtaining step or in the different-property-component-related information obtaining portion, should be interpreted to encompass not only a case where the property-related information or the information related to the supply position (that has been unknown to the electronic-circuit assembling system) is detected automatically in the electronic-circuit assembling system but also a case where the property-related information or the information related to the supply position (that has been prestored in a memory of the electronic-circuit assembling system) is read out in the electronic-circuit assembling system.

The above object may be achieved also by another electronic-circuit assembling process which is to be carried out in an electronic-circuit assembling system, for assembling an electronic circuit, by mounting a plurality of electronic circuit components supplied from at least one component supplier of a component supplying device, onto a circuit board supported by a board supporting device, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling process including: (I) a correlation-related information storing step of storing, in a memory, a component-supplier/different-property-component correlation-related information related to a correlation between a component-supplier-identification-related information and a property-related information, the component-supplier-identification-related information being related to an identification of at least one of the at least one component supplier that is to supply the at least one of the different-property components, the property-related information enabling recognition of the electrical property of the at least one of the different-property components which is supplied from the at least one of the at least one component supplier; (II) a component-supplier-identification-related-information detecting step of detecting the component-supplier-identification-related information of each of the at least one component supplier installed on the electronic-circuit assembling system, such that the detected component-supplier-identification-related information is correlated with a component supply position that is a position of the installation of the each of the at least one component supplier; (III) a different-property-component-related information detecting step of detecting a different-property-component-related information including (a) a different-property-component supply position from which the at least one of the different-property components is supplied by the component supplying device and (b) the property-related information of the at least one of the different-property components which is supplied by the component supplying device, based on the component-supplier-identification-related information and the component supply position of the each of the at least one component supplier detected in the component-supplier-identification-related-information detecting step, and based on the component-supplier/different-property-component correlation-related information stored in the memory; (IV) a mounting step of mounting the plurality of electronic circuit components onto the circuit board, by supplying, based on at least information related to the different-property-component supply position obtained in the different-property-component-related information detecting step, the plurality of electronic circuit components including the at least one of the different-property components, from the at least one component supplier of the component supplying device; and (V) a property-related information providing step of providing the circuit board onto which the at least one of the different-property components has been mounted in the mounting step, with the property-related information of the at least one of the different-property components which has been detected in the different-property-component-related information detecting step.

The above object may be achieved also by an electronic-circuit assembling system for assembling an electronic circuit, by mounting a plurality of electronic circuit components onto a circuit board, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling system including: (a) a board supporting device configured to support the circuit board; (b) a component supplying device including (b-1) a plurality of component suppliers each of which is configured to store therein ones of the plurality of electronic circuit components that are categorized as one kind of electronic circuit components, and each of which is configured to sequentially supply the categorized ones of the plurality of electronic circuit components and (b-2) a component-supplier holder having a plurality of holding portions holding the component suppliers; and (c) an electronic-circuit-component mounter including a mounting device configured to receive the plurality of electronic circuit components supplied from the component supplying device and to mount the electronic circuit components onto the circuit board supported by the board supporting device; the electronic-circuit assembling system further including: (A) a different-property-component-related information obtaining portion configured to automatically detect a different-property-component-related information including (i) a property-related information that enables recognition of the electrical property of at least one of the at least one of the different-property components which is stored in at least one of the plurality of component suppliers and (ii) a holding-portion position that is a position of one of the plurality of holding portions which holds the at least one of the plurality of component suppliers, such that the different-property-component-related information is obtained by detecting at least the property-related information; (B) a mounting controlling portion configured, based on information of the holding-portion position obtained by the different-property-component-related information obtaining portion, to cause the mounting device to receive the plurality of electronic circuit components including the at least one of the different-property components, from the component supplying device, and to cause the mounting device to mount the plurality of electronic circuit components onto the circuit board supported by the board supporting device; and (C) a property-related information providing portion configured to provide the circuit board onto which the at least one of the different-property component has been mounted by operation of the mounting controlling portion, with the property-related information which has been obtained by the different-property-component-related information obtaining portion.

The above-described "one of the plurality of holding portions" may be either a randomly selected one of the plurality of holding portions or a predetermined one of the plurality of holding portions. In the former case, the different-property-component-related information obtaining portion includes a portion configured to automatically detect which one of the plurality of holding portions holds the component supplier storing therein a different-property component having an randomly selected, electrical property value.

In the electronic-circuit assembling process according to the present invention, even if at least one of the electrical property value and the supply position of the different-property component is unknown (unclear), the different-property-component-related information is obtained in the different-property-component-related information obtaining step, so that the different-property component can be mounted onto the circuit board and the property-related information can be given to the circuit board. Therefore, the operator of the electronic-circuit assembling system can cause the system to assemble the electric circuit, by arbitrarily determining at least one of the electrical property and the supply position of the different-property component, thereby making it possible to increase the degree of freedom in operations carried out in an assembling workshop for assembling the electronic circuit.

For example, where the different-property-component supply position is already known (namely, is predetermined and information related to the predetermined component supply position is stored in the memory of the electronic-circuit assembling system) while the electrical property value of the different-property component is unknown, the detection of the electrical property value makes it possible to provide the circuit board with the property-related information. The electrical property value can be utilized, for example, also in preparation of information related to record of mounting of the different-property components onto the circuit board. Where a plurality of kinds of different-property components that are different from each other with respect to the electrical property value are supplied from a plurality of component suppliers, it is possible to select the kind of different-property components that are to be mounted onto the circuit board, on the basis of the electrical property value. Where a single kind of different-property components whose electrical property value is unknown are supplied from a single component supplier, the detection of the electrical property value makes it possible to provide the circuit board with the property-related information.

Further, where the electrical property value of the different-property component is already known while the different-property-component supply position is unknown, the detection of the component supply position makes it possible to take the different-property component from the component supplier and to mount the different-property component onto the circuit board.

Further, where both of the electrical property value and the component supply position of the different-property component are unknown, the detections of the electrical property value and the different-property-component supply position make it possible to obtain advantages provided by those detections.

In any one of the above cases, the provision of the property-related information on the circuit board makes it possible to obtain the electrical property value of the different-property component, from the circuit board as such. Since the provision of the property-related information on the circuit board is carried out as a procedure following the mounting of the different-property component on the circuit board, it is possible to reduce a possibility of mismatching of the electrical property value of the different-property component actually mounted on the circuit board, with the electrical property value recognized through the property-related information. Therefore, it is possible to reduce errors in a procedure for determining an electronic circuit component (associated component) that is to be associated with the different-property component, a procedure for sorting the circuit board upon assembling or packing for associating the circuit board with another element based on the electrical property value of the mounted different-property component, or other procedure carried out for the circuit board based on the electrical property value.

Further, in the above-described another electronic-circuit assembling process according to the present invention, the detection of the different-property-component-related information is made based on the detections of the component-supplier-identification-related information and the component supply position and the memorization of the component-supplier/different-property-component correlation-related information. Therefore, even if both of the electrical property value and the supply position of the supplied different-property component are unknown, it is possible to obtain both of them, thereby obtaining advantages provided in such as case where both of them are unknown.

Further, in the electronic-circuit assembling system according to the present invention, even where the electrical property value of the different-property component is unknown, the mounting of the different-property component onto the circuit board and the provision of the property-related information onto the circuit board can be made.

Various Modes of the Invention

There will be described various modes of the invention deemed to contain claimable features for which protection is sought. Hereinafter, the invention deemed to contain the claimable features will be referred to as "claimable invention" where appropriate. The claimable invention includes at least "the present invention" or "the invention of the present application" which is an invention described in claims, and could include also specific concept of the invention of the present application, generic concept of the invention of the present application and other concept of the invention of the present application. Each of these modes of the invention is numbered like the appended claims and depends from the other mode or modes, where appropriate, for easier understanding of the technical features disclosed in the present specification. It is to be understood that the claimable invention is not limited to the technical features or any combinations thereof which will be described in each of these modes. That is, the scope of the claimable invention should be interpreted in the light of the following descriptions accompanying the various modes and preferred embodiments of the invention. In a limit in accordance with such an interpretation, a mode of the claimable invention can be constituted by not only each one of these modes but also either a mode provided by any one of these modes and additional components incorporated therein or a mode provided by any one of these modes without some of components recited therein.

(1) An electronic-circuit assembling process which is to be carried out in an electronic-circuit assembling system, for assembling an electronic circuit, by mounting a plurality of electronic circuit components supplied from at least one component supplier of a component supplying device, onto a circuit board supported by a board supporting device, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling process including:

a different-property-component-related information obtaining step of obtaining a different-property-component-related information including (a) a property-related information that enables recognition of the electrical property of the at least one of the different-property components which is supplied from at least one of the at least one component supplier and (b) a different-property-component supply position that is a position of the at least one of the at least one component supplier supplying the at least one of the different-property components, such that the different-property-component-related information is obtained by detecting at least one of the property-related information and the different-property-component supply position;

a mounting step of mounting, based on at least information related to the different-property-component supply position obtained in the different-property-component-related information obtaining step, the plurality of electronic circuit components including the at least one of the different-property components, onto the circuit board; and a property-related information providing step of providing the circuit board with the property-related information of the at least one of the different-property components which is mounted on the circuit board in the mounting step.

(2) An electronic-circuit assembling process according to mode (1), wherein the different-property-component-related information obtaining step includes a step of obtaining the different-property-component-related information by detecting at least one of the property-related information and the different-property-component supply position.

(3) An electronic-circuit assembling process which is to be carried out in an electronic-circuit assembling system, for assembling an electronic circuit, by mounting a plurality of electronic circuit components supplied from at least one component supplier of a component supplying device, onto a circuit board supported by a board supporting device, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling process comprising:

a correlation-related information storing step of storing, in a memory, a component-supplier/different-property-component correlation-related information related to a correlation between a component-supplier-identification-related information and a property-related information, the component-supplier-identification-related information being related to an identification of at least one of the at least one component supplier that is to supply the at least one of the different-property components, the property-related information enabling recognition of the electrical property of the at least one of the different-property components which is supplied from the at least one of the at least one component supplier;

a component-supplier-identification-related-information detecting step of detecting the component-supplier-identification-related information of each of the at least one component supplier installed on the electronic-circuit assembling system, such that the detected component-supplier-identification-related information is correlated with a component supply position that is a position of the installation of the each of the at least one component supplier;

a different-property-component-related information detecting step of detecting a different-property-component-related information including (a) a different-property-component supply position from which the at least one of the different-property components is supplied by the component supplying device and (b) the property-related information of the at least one of the different-property components which is supplied by the component supplying device, based on the component-supplier-identification-related information and the component supply position of the each of the at least one component supplier detected in the component-supplier-identification-related-information detecting step, and based on the component-supplier/different-property-component correlation-related information stored in the memory;

a mounting step of mounting the plurality of electronic circuit components onto the circuit board, by supplying, based on at least information related to the different-property-component supply position obtained in the different-property-component-related information detecting step, the plurality of electronic circuit components including the at least one of the different-property components, from the at least one component supplier of the component supplying device; and a property-related information providing step of providing the circuit board onto which the at least one of the different-property components has been mounted in the mounting step, with the property-related information of the at least one of the different-property components which has been detected in the different-property-component-related information detecting step.

A property-related-information providing device, which is configured to provide the property-related information, may be provided in an electronic-circuit-component mounter capable of automatically obtaining the different-property-component-related information, or may be provided apart from the electronic-circuit-component mounter. In the latter case, the property-related-information providing device may be provided in another electronic-circuit-component mounter or may be provided on an apparatus which is other than the electronic-circuit-component mounters. Were the property-related-information providing device is provided in the apparatus other than the component mounters, this apparatus may be either an apparatus assigned to perform an operation other than the mounting operation or an apparatus (hereinafter referred to as "property-related information provider" where appropriate) assigned to perform exclusively the operation for providing the circuit board with the property-related-information.

(4) The electronic-circuit assembling process according to any one of modes (1)-(3), including:

using, as the electronic-circuit assembling system, a system including an electronic-circuit-component mounter having a mounting device that is configured to mount the electronic circuit components onto the circuit board after taking the electronic circuit components from the component supplying device;

using, as the component supplying device, a device including (i) a plurality of component suppliers as the at least one component supplier each of which is configured to store therein the plurality of electronic circuit components and to sequentially supply the plurality of electronic circuit components to the mounting device and (ii) a component-supplier holder having a plurality of holding portions configured to detachably hold the plurality of component suppliers;

causing at least one of the plurality of component suppliers to store therein the at least one of the different-property components;

causing at least one of the plurality of holding portions to bold the at least one of the plurality of component suppliers storing therein the at least one of the different-property components; and causing the electronic-circuit-component mounter to automatically obtain ($\alpha$) a position of the at least one of the plurality of holding portions holding the at least one of the plurality of component suppliers and ($\beta$) the property-related information of the at least one of the different-property components which is supplied from the at least one of the plurality of component suppliers.

As the component supplier, there are a component feeder (e.g., tape feeder, bulk feeder, stick feeder) and a tray having a multiplicity of recesses which are formed to lie on a plane and which are configured to accommodate therein the components. The electronic circuit components are held by a component holding member such as tape, component storage casing and stick. The tape is held by a tape holding member such as a reel (on which tape is wound) and a tape storage casing (which stores the tape therein). The tray serves as the component supplier and also as the component holding member. The component supplying device may be constituted by the component feeder and/or the tray, so as to supply the electronic circuit components.

The position of the holding portion (in which the component supplier is to be held by the holding portion), i.e., the install position (in which the component supplier is to be installed on the component-supplier bolder) or the component supply position (in which the different-property component is to be supplied from the component-supplier holder) does not have to be located in a limited position but may be located in a desired position suitable for facilitating the operator to carry out an operation for installing the component supplier onto the component-supplier holder. Further, where the position of the holding portion (in which the component supplier is to be held by the holding portion) has been predetermined, even if the component supplier is actually held by the holding portion in a position different from the predetermined position, it is possible to know the different position in which the holding portion actually holds the component supplier, and accordingly to mount the different-property component supplied from component supplier, onto the circuit board.

(5) The electronic-circuit assembling process according to any one of modes (1)-(4), including:

using, as the electronic-circuit assembling system, a system including a mounter line constituted by a plurality of electronic circuit-component mounters that are arranged in a line, with each adjacent two of the arranged electronic-circuit-component mounters being close to each other without a gap which allows the circuit board to be taken out through the gap;

causing at least one of the arranged electronic-circuit-component mounters to mount at least one of the at least one of the different-property components onto the circuit board; and causing at least one of the arranged electronic-circuit-component mounters to provide the circuit board with the property-related information of the at least one of the at least one of the different-property components.

The property-related information may be provided on the circuit board by either the electronic-circuit-component mounter assigned to mount the different-property component onto the circuit board, or another electronic-circuit-component mounter that is other than the electronic-circuit-component mounter assigned to mount the different-property component onto the circuit board. In the latter case, the mounting of the different-property component and the provision of the property-related information are made by respective two of the plurality of electronic-circuit-component mounters. In either of the former and latter cases, there is no risk that the circuit board would be taken out by the operator or another circuit board would be introduced by the operator, at a stage between the mounting of the different-property component and the provision of the property-related information (i.e., after the mounting of the different-property component before the provision of the property-related information, or after the provision of the property-related information before the mounting of the different-property component), so that the property-related information can be reliably given or provided on the circuit board on which the different-property component has been mounted or is to be mounted.

It is noted that, for establishing a state in which "each adjacent two of the arranged electronic-circuit-component mounters being close to each other without a gap which allows the circuit board to be taken out therethrough", the gap between each adjacent two of the arranged electronic-circuit-component mounters may be adapted to be smaller than a dimension of the circuit board as measured in a direction in which the plurality of electronic-circuit-component mounters are arranged. Specifically, this gap may be adapted to be not larger than 200 mm, 100 mm or 50 mm, for example.

(6) The electronic-circuit assembling process according to any one of modes (1)-(5), including:

using, as the electronic-circuit assembling system, a system including a mounter line constituted by a plurality of electronic-circuit-component mounters that are arranged in a line, with each adjacent two of the arranged electronic-circuit-component mounters being close to each other without a gap which allows the circuit board to be taken out through the gap;

causing at least one of the arranged electronic-circuit-component mounters to recognize the property-related information provided in the circuit board; and causing at least one of the arranged electronic-circuit-component mounters to mount, onto the circuit board, at least one of the electronic circuit components, which is determined to be associated with the at least one of the at least one of the different-property components, on the basis of the recognition of the property-related information.

The associated component (i.e., the electronic circuit component, which is determined to be associated with the different-property component) may be mounted onto the circuit board by either the electronic-circuit-component mounter assigned to recognize the property-related information, or another electronic-circuit-component mounter that is other than the electronic-circuit-component mounter assigned to recognize the property-related information. In either of the former and latter cases, there is no risk that the circuit board is taken out by the operator or another circuit board is introduced by the operator, at a stage between the recognition of the property-related information and the mounting of the associated component (i.e., after the recognition of the property-related information before the mounting of the associated component), so that the associated component, which suitably corresponds to the recognized property-related information, namely, which is to be associated with the different-property component whose electrical property is represented by the recognized property-related information, can be reliably mounted on the circuit board. The different-property component and the associated component may be mounted on the same side surface of the circuit board or on respective opposite side surfaces of the circuit board.

It is noted that, in the electronic-circuit assembling system, there may be provided a recognizing device that is to be used exclusively to recognize the property-related information, or there may be provided a property-related-information recognizer that is constituted by an apparatus configured to perform an operation other than the operation for mounting the electronic circuit components onto the circuit board. The recognizing device may be provided either in the mounter line or outside the mounter line. The property-related-information recognizer may be configured to recognize not only the property-related information but also other information other than the property-related information.

(7) The electronic-circuit assembling process according to any one of modes (1)-(6), including:
using, as the electronic-circuit assembling system, a system including a plurality of electronic-circuit-component mounters;
causing at least a part of the electronic-circuit-component mounters to mount at least one of the at least one of the different-property components onto the circuit board;
causing at least a part of the electronic-circuit-component mounters to provide the circuit board with the property-related information;
causing at least a part of the electronic-circuit-component mounters to recognize the property-related information provided in the circuit board; and
causing at least a part of the electronic-circuit-component mounters to mount, onto the circuit board, at least one of the electronic circuit components, which is determined to be associated with the at least one of the at least one of the different-property components, on the basis of the recognition of the property-related information.

The plurality of electronic-circuit-component mounters may be constituted by either mounters cooperating with each other to form a mounter line or mounters do not form the mounter line. Further, the mounting of the different-property component, provision of the property-related information, recognition of the property-related information and mounting of the associated component may be made by respective different ones of the electronic-circuit-component mounters, or alternatively, at least two of the these operations or works may be made by a same one of the electronic-circuit-component mounters.

(8) The electronic-circuit assembling process according to any one of modes (1)-(7), including:
using, as the electronic-circuit assembling system, a system including a plurality of electronic-circuit-component mounters;
causing one of the electronic-circuit-component mounters to mount at least one of the at least one of the different-property components onto the circuit board;
causing the one of the electronic-circuit-component mounters to provide the circuit board with the property-related information of the at least one of the at least one of the different-property components;
causing another one of the electronic-circuit-component mounters to recognize the property-related information provided in the circuit board; and
causing the another one of the electronic-circuit-component mounters to mount, onto the circuit board, at least one of the electronic circuit components, which is determined to be associated with the at least one of the at least one of the different-property components, on the bags of the recognition of the property-related information.

In the electronic-circuit assembling process according to this mode (8), the mounting of the different-property component onto the circuit board and the mounting of the associated component onto the circuit board can be carried out in parallel with each other or concurrently with each other. The provision of the property-related information on the circuit board and the recognition of the property-related information provided on the circuit board make it possible to mount, onto the circuit board, the associated component that is to be associated with the different-property component actually mounted on the circuit board. Since the mounting of the different-property component and the provision of the property-related information are both made by a same one of the electronic-circuit-component mounters, while the recognition of the property-related information and the mounting of the associated component are both made by a same one of the electronic-circuit-component mounters. Therefore, there is very little possibility that the circuit board would be taken out from the electronic-circuit-component mounter or another circuit board would be introduced into the electronic-circuit-component mounter at a stage after the mounting of the different-property component before the provision of the property-related information and also at a stage after the recognition of the property-related information before the mounting of the associated component, so that, as a consequence, it is possible to remarkably reduce a risk that a wrong component would be mounted erroneously as the associated component onto the circuit board. Besides, where the above-described one of the electronic-circuit-component mounters and the above-described another one of the electronic-circuit-component mounters cooperate with each other to form a mounter line as recited in the above mode (5) or (6), the risk of the erroneous mounting of a wrong component as the associated component can be further reduced.

(9) The electronic-circuit assembling process according to any one of modes (1)-(8), including:
using, as the electronic-circuit assembling system, a system including a mounter line constituted by a plurality of electronic-circuit-component mounters each having a mounting device;
causing the mounting device of one of the plurality of electronic-circuit-component mounters, to hold, in place of a mounting head configured to mount the electronic circuit components on the circuit board, a property-related-information providing head configured to provide the circuit board with the property-related information; and causing the one of the plurality of electronic-circuit-component mounters to provide the circuit board with the property-related information.

The above-described one of the electronic-circuit-component mounters in which the property-related-information providing head, in place of the mounting head, is held by the mounting device may be either an intermediate one or a final one (i.e., downstream most one) of the mounters in the mounter line. In the former case, the mounting of the different-property component is made by a part of the mounters, and the provision of the property-related information is made by the above-described intermediate one of the mounters which is located on a downstream side of a final one among the part of the mounters. The change of the mounting head into the property-related-information providing head may be made automatically or manually by the operator. The automatic head change can be made by, for example, an arrangement, as disclosed in JP-2006-261825A, in which the head is selectively clamped and undamped by selectively supplying a vacuum pressure to a head holder (holding the head) and stopping the supply of the vacuum pressure to the head holder.

It might be possible to employ a property-related information providing device which does not have a component mounting function and which is to be used exclusively to provide the property-related information such that the property-related information providing device is disposed in an intermediate position or a final position within the mounter line. On the other hand, in the process according to this mode (9), the one of the electronic-circuit-component mounters can be used also as the above-described property-related information provider, thereby making it possible to provide the property-related information while avoiding an increase of required length of the mounter line and an increase of cost required for the system. Thus, saving of the space required for the system and saving of the cost required for system can be both realized. Further, in a case where the electronic circuit components not including any one of the different-property components are to be mounted onto a circuit board, or in a case where the different-property component or components not requiring provision of the property-related information are to be mounted onto a circuit board, the components can be mounted onto the circuit board by causing the mounting device to hold the mounting head without causing the mounting device to hold the property-related-information providing head. Thus, in the process according to this mode (9), it is possible to assemble various kinds of electronic circuits.

(10) The electronic-circuit assembling process according to any one of modes (1)-(9), including:

using, as the electronic-circuit assembling system, a system including at least one electronic-circuit-component mounter each having a plurality of mounting devices;

causing one of the mounting devices to hold, in place of a mounting head configured to mount the electronic circuit components on the circuit board, a property-related-information providing head configured to provide the circuit board with the property-related information;

causing the at least one electronic-circuit-component mounter to mount at least one of the at least one of the different-property components onto the circuit board; and causing the at least one electronic-circuit-component mounter to provide the circuit board with the property-related information.

in the electronic-circuit assembling process according to this mode (10), the mounting of the different-property component and the provision of the property-related information can be both made in the single electronic-circuit-component mounter. Until all the operations having been scheduled to be carried out in the single electronic-circuit-component mounter are completed, the circuit board is unlikely to be taken out from the same electronic-circuit-component mounter, thereby more satisfactorily assuring matching of the electrical property value of the different-property component actually mounted on the circuit board, with the electrical property value recognized through the property-related information.

It is noted that, the method of providing the circuit board with the property-related information by causing the mounting device to hold the property-related-information providing head in place of the mounting head, as described in the above mode (9) or (10), can be employed in a case where the circuit board is to be provided with a circuit-board identifier that identifies the circuit board. The provision of the circuit-board identifier on the circuit board makes it possible to identify each circuit board and to utilize the identification of each circuit board, for example, in preparation of a record of operations carried out for assembling the electronic circuits. The features recited in the above mode (9) or (10) may be employed independently of any one of the features recited in the above-modes (1)-(8).

(11) The electronic-circuit assembling process according to any one of modes (1)-(10), wherein the property-related information providing step is carried out by causing a printing head to print the property-related information onto the circuit board.

The printing head may be substantially identical in construction with either a printing head of an inkjet printer or a printing head of a printing mechanism of a laser printer. As the printing mechanism using a laser beam, a laser marker may be employed, for example. As disclosed in JP-H11-87805A and JP-H06-143689A, for example, the laser marker is constructed to include a laser beam source configured to irradiate the laser beam, a focusing lens and a mirror, and is configured to record characters or the like on a surface of a print object by applying heat onto the surface of the print object.

(12) The electronic-circuit assembling process according to any one of modes (1)-(11), including:

using, as the electronic-circuit assembling system, a system including an electronic-circuit-component mounter having a mounting device;

installing a plurality of component suppliers on the electronic-circuit-component mounter;

causing the plurality of component suppliers to supply, as the at least one of the different-property components, a plurality of kinds of different-property components which are different with respect to level of the electrical property, value, such that each one of the kinds of different-property components are to be supplied from a corresponding one of the component suppliers; and causing the electronic-circuit-component mounter to mount the plurality of kinds of different-property components supplied from the component suppliers, onto the circuit board supported by the board supporting device.

Even where the different-property components of a single kind are to be mounted on a single circuit board, if the different-property components of the single kind becomes zero or insufficient for completing mounting of a required number of different-property components of the single kind, the different-property components of the same kind may be changed to the different-property components of another kind so that the different-property components of a plurality kinds are mounted onto the single circuit board.

By obtaining the different-property-component-related information, the level of the electrical property value of the different-property component (that is to be supplied) and the supply position of the electrical property value can be known, thereby making it possible to mount, onto the circuit board, the different-property component having a required level of the electrical property value and to replace the kind of the different-property component, to be mounted onto the circuit board, with another kind of the different-property component.

(13) The electronic-circuit assembling process according to mode (12), wherein each one of the plurality of kinds of different-property components, which are to be mounted onto the circuit board, consist of a plurality of different-property components.

(14) The electronic-circuit assembling process according to mode (13), including:

determining a plurality of mount-position groups such that each one of determined plurality of mount-position groups is constituted by a plurality of mount positions in which the plurality of different-property components are to be mounted onto the circuit board; and mounting the different-property components which are the same as each other with respect to the electrical property value, onto the respective mount positions of each one of the plurality of mount-position groups, wherein the property-related information providing step is implemented by providing the circuit board with the property-related information such that the provided property-related information is correlated with each one of the plurality of mount-position groups.

The "different-property components which are the same as each other with respect to the electrical property value" may be interpreted to encompass "different-property components which are the same as each other with respect to a nominal value of the electrical property value and an error level (i.e., the different-property components which are the same as each other with respect to the nominal value of the electrical property value and the level of a difference between the nominal value and an actual value of the electrical property value)" and "different-property components which are the same as each other with respect to level of the electrical property value (i.e., the different-property components having the respective electrical property values that belong to the same one of a plurality of different levels of the electrical property value).

Since the different-property components, which are to be mounted into the respective mount positions of each one of the plurality of mount-position groups, are the same as each other with respect to the electrical property, the property-related information does not have to be provided in correlation with each one of the different-property components mounted in the respective mount positions of each one of the mount-position groups, as long as the property-related information is provided in correlation with each one of the plurality of mount-position groups.

(15) The electronic-circuit assembling process according to any one of modes (1)-(14), including:

mounting a plurality of light emitting diodes as the at least one of the different-property components, onto the circuit board;

providing the circuit board with, as the property-related information, a brightness-level-related information that enables recognition of a brightness level as the electrical property value of the light emitting diodes; and mounting, onto the circuit board, at least one resistor as at least one of the electronic circuit components, which has a resistance value determined based on the bright level, and which is determined to be associated with the light emitting diodes, on the basis of the recognition of the bright level.

In recent years, there is a need for a technique for mounting a multiplicity of electronic circuit components that are identical with one another or the same as each other, onto a single circuit board. As an example of such a technique, there is known a technique for mounting a multiplicity of light emitting diodes (hereinafter simply referred to as "LEDs") onto a single circuit board, for thereby manufacturing light sources such as a television display, a computer display, a backlight for a vehicle's instrument panel indicator, vehicle's backlight and frontlight and a general purpose luminaire.

LED has many advantages such as high energy efficiency, long service life and low cost. However, in today's manufacturing technology, it is still difficult to manufacture LED such that the manufactured LED is provided with a highly accurate and constant brightness. The backlight or the like is required to have brightness that is uniform over an entirety of its light emitting surface. The LED is sensibly influenced by factors such as change of environment (e.g., temperature and humidity) in process of manufacture of the LED. For example, its property, particularly, its brightness exhibited upon supply of a rated current to the LED is likely to be variable depending on variation of the manufacture environment. That is the LED corresponds to a property-variable component which has an electrical property value that is variable at a plurality of levels and which could be, for example, handled as if being a property-non-variable component (i.e., electronic circuit component whose electrical property is not variable at a plurality of levels) in a case where a control is performed to merely control mounting of the component onto the circuit board. In other words, the LEDs correspond to the above-described different-property components which have respective electrical properties such that the electrical properties of at least two of the different-property components are different from each other, and which can be handled as if being components that are same as each other, in a control for controlling mounting of the components onto the circuit board. In view of this, the LEDs are sorted into a plurality of groups of respective different brightness levels, and the LEDs sorted into the same group and having the same brightness levels are mounted onto a single circuit board or onto each one of a plurality of areas within the single circuit board, so that it is considered that the brightness could be made uniform over n entirety of the light emitting surface, by controlling an electric current (that is supplied to each of the LEDs) by at least one resistor. In the electronic-circuit assembling process according to this mode (15), owing to the provision of the brightness-level-related information onto the circuit board together with the mounting of the LEDs onto the circuit board, it is possible to mount, onto the circuit board, the at least one resistor suitable for the brightness of the LEDs that have been actually mounted onto the circuit board. For example, even in a case where the LED actually mounted on the circuit board has a brightness level that mismatches with a predetermined brightness level for some reason, the property-related information that is provided after the mounting of the LEDs onto the circuit board makes it possible to reliably mount, onto the circuit board, the at least one resistor which is suitable for the brightness of the LEDs having been actually mounted onto the circuit board, namely, which is to be associated with the actually mounted LEDs.

Where the plurality of LEDs are mounted onto the circuit board, the at least one resistor as the associated component may be mounted so as to be associated with each one of the LEDs, or mounted commonly for two or more of the LEDs so as to be associated with the two or more of the LEDs. The LEDs, each of which are to be associated by the at least one resistor, may correspond to either all the LEDs mounted on the circuit board or a part of the LEDs mounted on the circuit board. Similarly, the LEDs, whose brightness level is represented by the brightness-level-related information, may correspond to either all the LEDs mounted on the circuit board or a part of the LEDs mounted on the circuit board.

It is noted that the brightness-level-related information may include not only the brightness level as such but also another information having one-to-one correspondence with the brightness level.

(20) An electronic-circuit assembling system for assembling an electronic circuit, by supplying a plurality of electronic circuit components from at least one component supplier of a component supplying device, and mounting the plurality of electronic circuit components onto a circuit board, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling system including:

a different-property-component-related information obtaining portion configured to obtain a different-property-component-related information including (i) a property-related information that enables recognition of the electrical property of the at least one of the different-property components which is supplied from at least one of the at least one component supplier and (ii) a different-property-component supply position that is a position of the at least one of the at least one component supplier supplying the at least one of the different-property components, a mounting controlling portion configured, based on information of the different-property-component supply position obtained by the different-property-component-related information obtaining portion, to cause the at least one of the different-property components to be mounted onto the circuit board; and a property-related information providing portion configured to provide the circuit board with the property-related information which has been obtained by the different-property-component-related information obtaining portion.

The property-related information providing portion may be provided in the electronic-circuit-component mounter having the different-property-component-related information obtaining portion or may be provided apart from the electronic-circuit-component mounter having the information obtaining portion.

It is noted that the technical features described, in any one of above modes (2)-(15) are applicable to the electronic-circuit assembling system to this mode (20).

(21) An electronic-circuit assembling system for assembling an electronic circuit, by mounting a plurality of electronic circuit components onto a circuit board, wherein the plurality of electronic circuit components includes at least one of different-property components having respective electrical properties such that the electrical properties of at least two of the different-property components are different from each other, and wherein the different-property components can be handled as being components that are same as each other, in a control for controlling mounting of the components onto the circuit board, the electronic-circuit assembling system comprising:

(a) a board supporting device configured to support the circuit board;

(b) a component supplying device including (b-1) a plurality of component suppliers each of which is configured to store therein ones of the plurality of electronic circuit components that are categorized as one kind of electronic circuit components, and each of which is configured to sequentially supply the categorized ones of the plurality of electronic circuit components and (b-2) a component-supplier holder having a plurality of holding portions holding the component suppliers; and (c) an electronic-circuit-component mounter including a mounting device configured to receive the plurality of electronic circuit components supplied from the component supplying device and to mount the electronic circuit components onto the circuit board supported by the board supporting device;

the electronic-circuit assembling system further comprising:

a different-property-component-related information obtaining portion configured to automatically detect a different-property-component-related information including (i) a property-related information that enables recognition of the electrical property of at least one of the at least one of the different-property components which is stored in at least one of the plurality of component suppliers and (ii) a holding-portion position that is a position of one of the plurality of holding portions which holds the at least one of the plurality of component suppliers, such that the different-property-component-related information is obtained by detecting at least the property-related information;

a mounting controlling portion configured, based on information of the holding-portion position obtained by the different-property-component-related information obtaining portion, to cause the mounting device to receive the plurality of electronic circuit components including the at least one of the different-property components, from the component supplying device, and to cause the mounting device to mount the plurality of electronic circuit components onto the circuit board supported by the board supporting device; and a property-related information providing portion configured to provide the circuit board onto which the at least one of the different-property components has been mounted by operation of the mounting controlling portion, with the property-related information which has been obtained by the different-property-component-related information obtaining portion.

It is noted that the technical features described in any one of above modes (2)-(15) are applicable to the electronic-circuit assembling system to this mode (21).

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 12 is a view showing a part of a mount data created by execution of a part of the operation flow of FIG. 11;

FIG. 13 is a view showing another part of the mounting data;

FIG. 14 is a view showing, by way of example, a substrate-piece/brightness-level correlation table that is obtained as a result of mounting of LEDs onto a multi-piece substrate by execution of the operation flow;

DETAILED DESCRIPTION OF THE PREFERRED EMBODIMENTS

There will be described embodiments of the claimable invention, by reference to the accompanying drawings. It is to be understood that the claimable invention is not limited to the embodiments, and may be otherwise embodied with various changes and modifications, such as those described in the foregoing "VARIOUS MODES OF THE INVENTION", which may occur to those skilled in the art.

Figure 1:
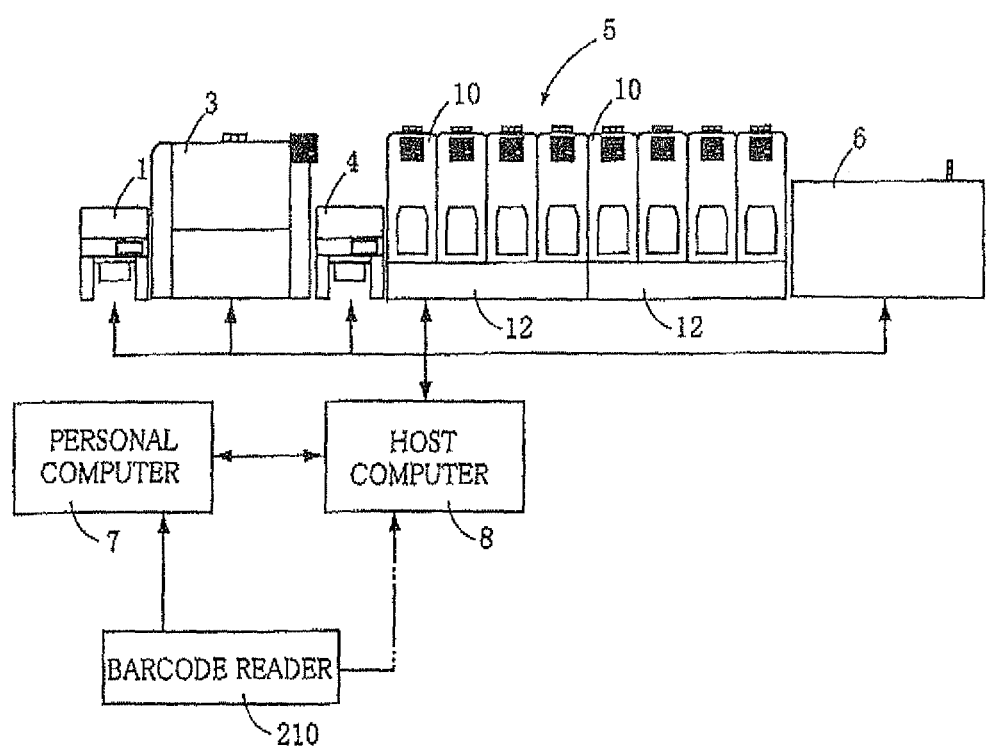
FIG. 1 is a front view showing an external appearance of an electronic-circuit assembling system that is to be used for carrying out an electronic-circuit assembling process according to an embodiment of the claimable invention.

FIG. 1 shows an electronic-circuit assembling system (hereinafter simply referred to as "assembling system") that is to be used for carrying out an electronic-circuit assembling process. This assembling system includes a substrate ID reading unit 1, a solder printer 3, another substrate ID reading unit 4, a mounter line 5 and a reflow furnace 6 that are arranged in a single line in this order of description, such that the substrate ID reading unit 1 is located in an upstream end position while the reflow furnace 6 is located in a downstream end position. Each of the substrate ID reading units 1, 4 is configured to read a circuit-board identifier (hereinafter simply referred to as "substrate ID") that is given or provided on a circuit board. The substrate ID may be represented by a barcode, for example. Each of the substrate ID reading units 1, 4 may be constituted by a barcode reader, for example. The solder printer 3 includes a controller that is constituted principally by a computer, and is configured to print a cream solder onto the circuit board, so that the printed cream solder serves to temporarily attach electronic circuit components onto the circuit board. The solder printer 3 may be constituted by a screen printer, for example. The mounter line 5 is constituted by a plurality of mounting modules 10 fixed to a plurality of bases 12 that are arranged side-by-side. Each adjacent four of the mounting modules 10 are arranged side-by-side, and are fixed to a corresponding one of the bases 12 which is common to the adjacent four mounting modules 10. The mounting modules 10 may be referred also to as electronic-circuit-component mounters, and are configured to mount the electronic circuit components onto the circuit board. The mounting modules 10 are assigned to perform respective assigned works in operations for mounting the electronic circuit components onto the circuit board, in parallel with each other, so that it is possible to reduce a cycle time required to mount the electronic circuit components onto the circuit board, as compared with a case in which the mounting operations are carried out by a single electronic-circuit-component mounter. The reflow furnace 6 is provided to fuse the cream solder by heating the cream solder and then to solder the electronic circuit components onto a printed circuit of the circuit board. The substrate ID reading units 1, 4, solder printer 3, mounting modules 10 and reflow furnace 6 will be hereinafter referred to as "component apparatuses" of the assembling system, which are generic terms of the ID reading units 1, 4, solder printer 3, mounting modules 10 and reflow furnace 6.

Each of the mounting modules 10 has a construction which is described in detail, for example, in JP-2004-104075A, so that its parts not related to the claimable invention will not be described in detail.

Figure 2:
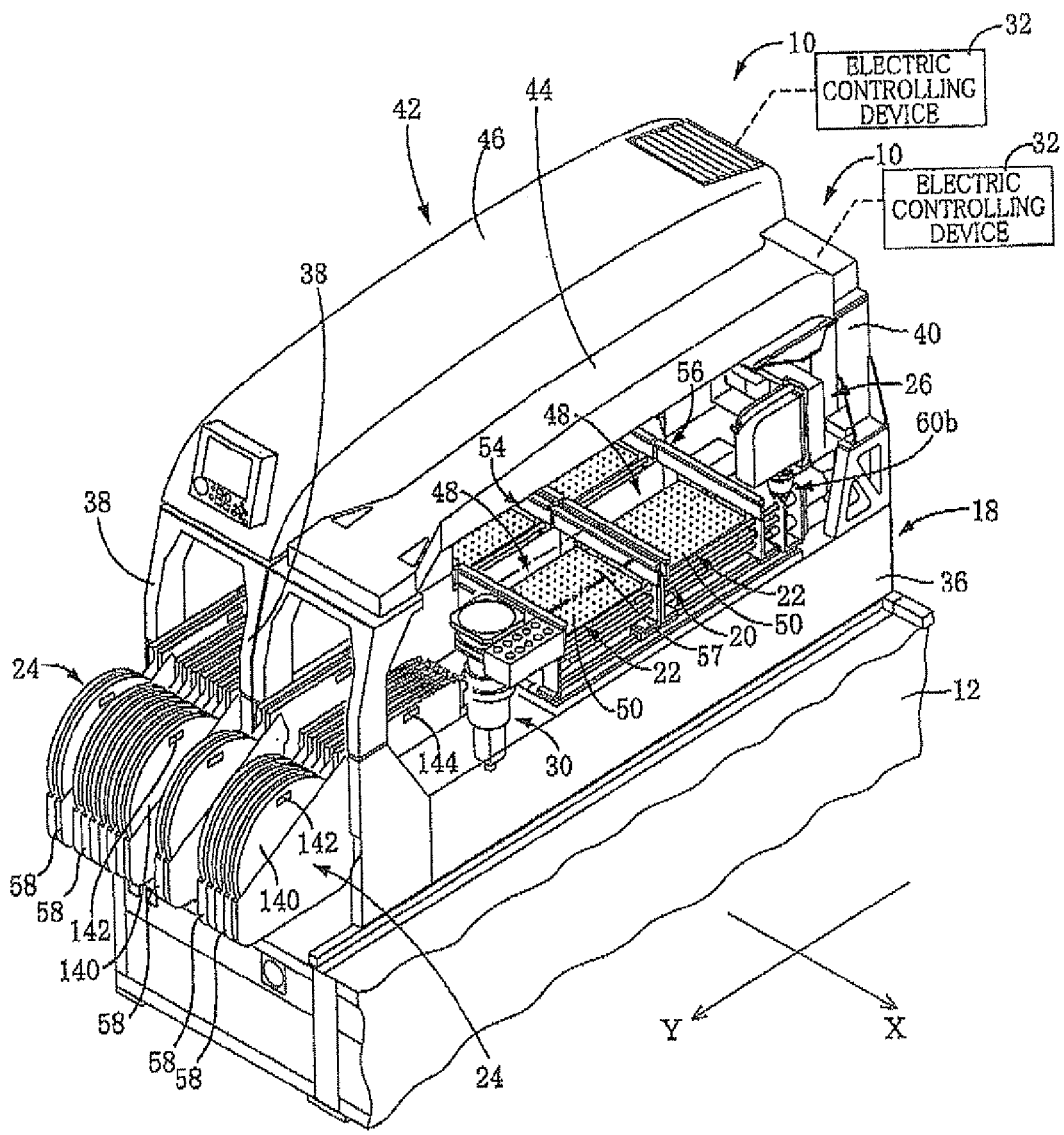
FIG. 2 is a perspective view showing a construction of a mounting module as a component of the electronic-circuit assembling system of FIG. 1, with an outside cover of the mounting module being partially cut away to illustrate an internal construction of the mounting module.

As shown in FIG. 2, each of the mounting modules 10 includes a module main body 18 as a main body frame, a circuit-board conveying device 20, a circuit-board holding device 22, a fiducial-mark-image taking device 28 (see FIG. 4), a component-image taking device 30 and an electric controlling device 32.

As shown in FIG. 2, the module main body 18 includes: a bed 36 that is elongated in a front-rear direction (i.e., Y-axis direction) of the mounting module 10; two front columns 38 that extend upwardly from a front end portion of the bed 36; two rear columns 40 that extend upwardly from a rear end portion of the bed 36; and a crown 42 that is supported by the four columns 88, 40. The crown 42 is constituted by a beam 44 as a reinforcing member and a cover 46 covering an upper side surface of the beam 44.

As shown in FIG. 2, the circuit-board conveying device 20 includes two circuit-board conveyors 54, 56, and is configured to convey each circuit board 57 (positioned in a central portion of the bed 86 in the front-rear direction of the mounting module 10), in a horizontal direction that is parallel to a direction in which the plurality of mounting modules 10 are arranged. The conveyance of each circuit board 57 is performed by at least one of the circuit-board conveyors 54, 56. The mounting modules 10, which cooperate with one another to form the mounter line 5, are arranged with each adjacent two of the arranged mounting modules 10 being close to each other without a gap which allows the circuit board 58 to be taken out through the gap. The transfer of the circuit board 57 between each adjacent two of the arranged mounting modules 10 is performed directly by cooperation of one of the circuit-board conveyors 54, 56 of one of the adjacent two mounting modules 10 and a corresponding to the circuit-board conveyors 54, 56 of the other of the adjacent two mounting modules 10. The gap between each adjacent two of the mounting modules 10 is adapted to be smaller than a dimension of a smallest kind of circuit boards 57 as measured in a circuit-board conveyance direction (in which the circuit boards 57 are to be conveyed), wherein the dimension of the smallest kind of circuit boards 57 is the smallest among those of all the kinds of circuit boards 57 onto which the electronic circuit components are to be mounted. In the present embodiment, this gap is 80 mm. Each of upstream-most one and downstream-most one of the plurality of mounting modules 10 forming the mounter line 5 is provided with an openable and closable cover, for opening and closing an opening (that is not what is provided for allowing loading/unloading of the circuit board) which is located on a side remote from another one of the mounting modules 10 that is adjacent to the upstream-most one or downstream-most one of the mounting modules 10. With this openable and closable cover being closed, an operator is not allowed to introduce his hand into the mounting module 10.

The circuit-board holding device 22 is provided in each of the two circuit-board conveyors 54, 56, and includes a board supporting device 48 and clamping members (not shown), such that the circuit board 57 takes a posture that causes its mount surface (onto which the electronic circuit components are to be mounted) to be held in parallel to a horizontal plane while the circuit board 57 is being held by the board supporting device 48. The board supporting device 48 includes: a plurality of supporting members (not shown) that are to support the circuit board 57 from the lower side; and a supporting base 50 supporting the supporting members. Each of the circuit-board conveyors 54, 56 is provided in a pair of side frames, and the clamping members are provided on the pair of side frames. The clamping members cooperate with pressing portions of the respective side frames, so as to grip opposite end portions of the circuit board 57 (which are parallel to the circuit-board conveyance direction) from the upper and lower sides of the board 57. In the following descriptions regarding the present embodiment, the circuit-board conveyance direction is referred to as X-axis direction while a direction orthogonal to the X-axis direction (on a horizontal plane, i.e., a plane parallel to the mount surface of the circuit board 57 held by the circuit-board holding device 22) is referred to as Y-axis direction.

As shown in FIG. 2, the component supplying device 24 is provided on a front side of the mounting module 10, i.e., on one of opposite sides, in the Y-axis direction, of the bed 36, which is remote from the circuit-board conveying device 20. The component supplying device 24 is configured to supply the electronic circuit components, for example, by means of tape feeders (hereinafter simply referred to as "feeders") 58. The component supplying device 24 includes, in addition to the plurality of feeders 58, a feeder holding base 160 (see FIG. 3) (hereinafter simply referred to as "holding base 150") serving as a component-supplier holder in the form of a feeder holder that holds the feeders 58. Each of the feeders 58 includes a feeding device 59 (see FIG. 8) that is configured to intermittently feed a component holding tape holding the multiplicity of electronic circuit components that are identical with one another, such that the component holding tap is fed by a constant distance (that corresponds to a pitch between each adjacent two of the electronic circuit components held by the component holding tap) in each one of the successive feed motions.

Figure 3:
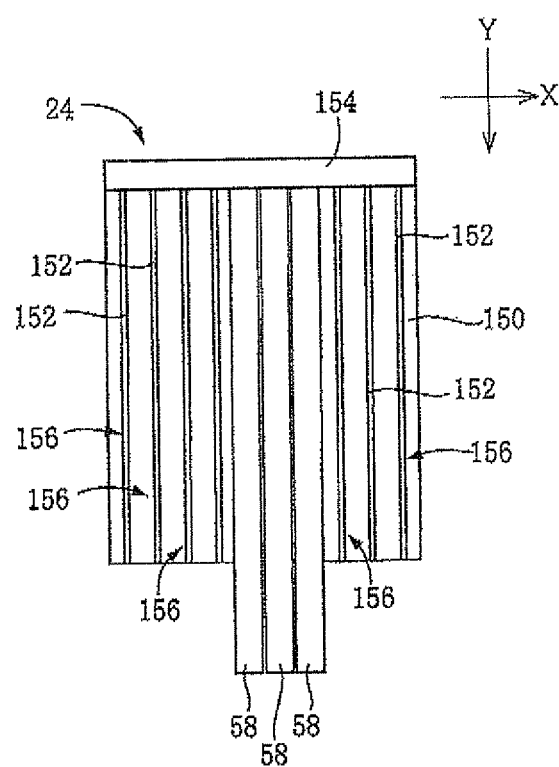
FIG. 3 is a plan view schematically showing a component supplier device of the mounting module of FIG. 2.

In the present embodiment, the holding base 150 is fixed onto the bed 36, and has a plurality of slots 152 (e.g., T slots) which extend in the Y-axis direction and which are equally spaced apart from each other in the X-axis direction, a shown in FIG. 3. The holding base 150 includes a vertically extending wall portion 154 that extends upwardly from a rear end portion (i.e., one of opposite end portions which is located on the side of the circuit-board conveying device 20) of the holding base 150. The vertically extending wall portion 154 has positioning holes and connectors (not shown) such that each pair of the positioning holes and each of the connectors are provided in a portion of the wall portion 154 which corresponds to a corresponding one of the slots 152. Each of the slots 152 cooperates with the corresponding portion in which the corresponding pair of positioning holes and the corresponding connector are provided, to constitute a holding portion 156. Thus, the holding base 150 has the plurality of holding portions 156.

Each of the feeders 58 is fitted, at a rail (not shown) provided on its lower surface, in a corresponding one of the slots 158. Each feeder 58 is positioned, in a predetermined position relative to the holding base 150, with a pair of positioning protrusions provided on a front surface of the feeder 58, being fitted in the above-described pair of positioning holes. Further, by manually operating an engaging device (not shown) by the operator, the plurality of feeders 58 as component suppliers are detachably fixed onto the holding base 150 such that the fixed feeders 58 are arranged in the X-axis direction. The plurality of holding portions 156 of the holding base 150 are located in respective holding-portion positions which define install positions in which the feeders 58 is installed to be held by the respective holding portions 156. Each of the install positions serves also as a component supply position in which the electronic circuit components are to be supplied from the corresponding feeder 58 held by the corresponding holding portion 156. The above-described connector of each of the holding portions 156 has a communicating portion 112 (see FIG. 8) and an electric power supplying portion (not shown), while a connector provided on the above-described front surface of each of the feeders 58 has a communicating portion 114 (see FIG. 8) and an electric-power receiving portion (not shown). Therefore, when each feeder 58 is installed on the corresponding holding portions 156, the connectors are connected to each other, so that the communicating portions 112, 114 become communicable with each other while an electric power can be supplied to the power receiving portion via the power supplying portion.

Figure 4:
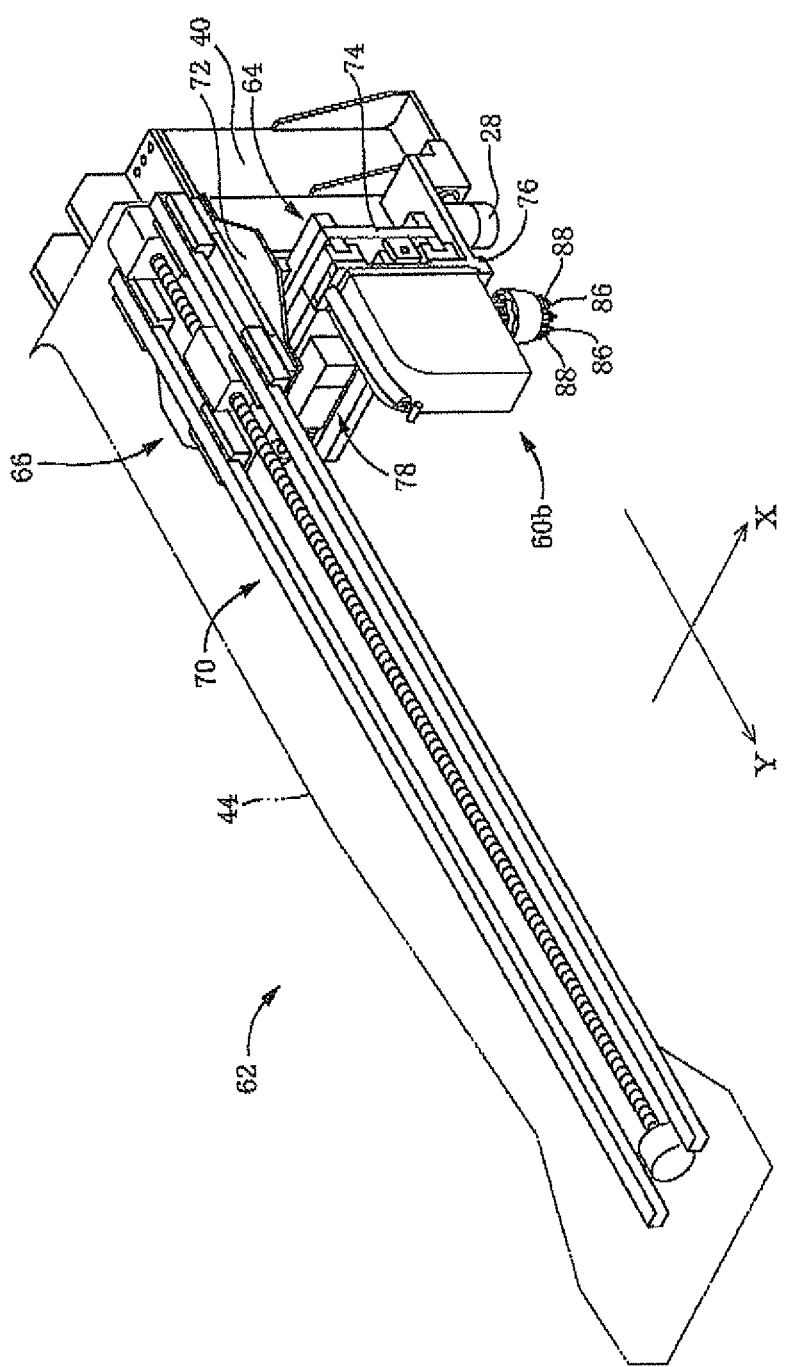
FIG. 4 is a perspective view schematically showing a component mounter of the mounting module of FIG. 2.

As shown in FIGS. 2 and 4, the mounting device 26 has a mounting head 60 (60a, 60b) and a head moving device 62 configured to move the mounting head 60 (60a, 60b). As shown in FIG. 4, the head moving device 62 has a X-axis direction moving device 64 and a Y-axis direction moving device 66. The Y-axis direction moving device 66 has a linear motor 70 which is provided in the crown 42 of the module main body 18 and which extends so as to bridge over a component supplying portion of the component supplying device 24 and the two circuit-board holding devices 22, so that a Y-axis slide 72 as a movable unit is movable to be positioned in a desired position by operation of the linear motor 70. In the present embodiment, the X-axis direction Moving device 64 is disposed on the Y-axis elide 72, and has first and second X-axis slides 74, 76 and two X-axis slide moving devices 78. The first and second X-axis slides 74, 76 are movable relative to the Y-axis slide 72 in the X-axis direction, and each of the X-axle slides 74, 76 is movable relative to the other of the X-axis slides 74, 76 in the X-axis direction. The two X-axis slide moving devices 78 are configured to moved the respective first and second X-axis slides 74, 76 in the X-axis direction. (In FIG. 4, only one of the two X-axis slide moving devices 78 which is configured to move the second X-axis slide 76 is shown.) Each of the two X-axis slide moving devices 78 includes, for example, a drive source in the form of an electric rotary motor (e.g., servo motor with rotary encoder) and a feed screw mechanism constituted by a ball screw and a nut, and is configured to move a corresponding one of the X-axis slides 74, 76 to a desired position. In the present embodiment, the drive source of each of the two X-axis slide moving devices 78 is constituted by the electric rotary motor in the form of a servo motor whose angular position is accurately controllable.

The mounting head 60 is detachably attached to the second X-axis slide 76, and is to be moved, by the head moving device 62, to be positioned in a desired position within a movement area, i.e., a mounting operation area that bridges over the component supplying portions of the component suppliers 24 and the two circuit-board holding device 22. The mounting head 60 is detachably attached to the second X-axis slide 76 by means of an attachment mechanism that has substantially the same construction as an attachment mechanism, for example, which is disclosed in JP-2004-221518A, so that the attachment mechanism will not be described and shown in the drawings. The mounting head 60 configured to hold the electronic circuit components through suction nozzles 86 (86a, 86b) as a kind of component holders. In the present embodiment, there are available various kinds of mounting heads 60 which are different from each other with respect to the number of nozzle holders as examples of component-holder holding portions each holding the suction nozzle 86, so that a selected one of the mounting heads 60, which is selected depending on kind of the circuit board 57 (onto which the electronic circuit components are to be mounted), is attached to the second X-axle slide 76.

Figure 5A:
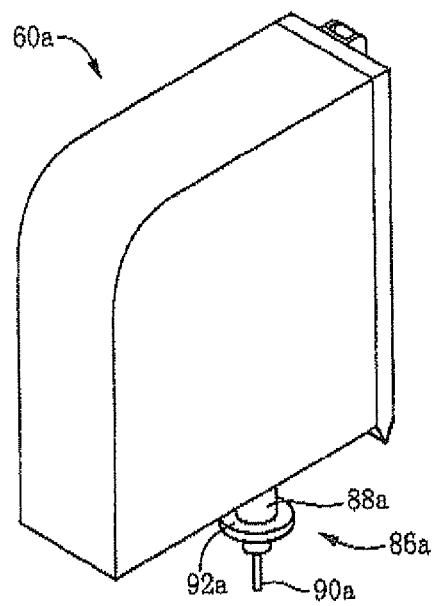
FIGS. 5A and 5B are a set of view showing two examples of a mounting head that is a part of the mounter of the mounting module of FIG. 2.
Figure 5B:
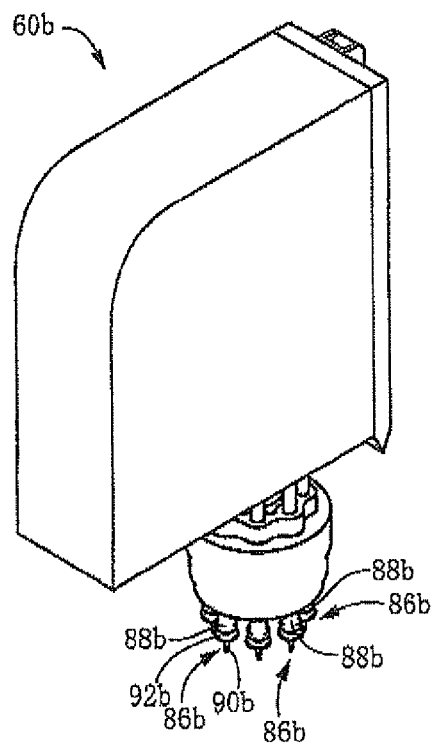

For example, a mounting head 60a as shown in FIG. 5A has a single nozzle holder 88a that holds one suction nozzle 86a, while a mounting head 60b as shown in FIG. 5B has a total of twelve nozzle holders 88b, so as to be capable of holding twelve suction nozzles 86b as a maximum number of suction nozzles 86b. The number of the nozzle holders 88b does not necessarily have to be twelve but may be any number not smaller than two, preferably, not smaller than three. Each of the suction nozzles 86 includes a suction tube 90 and a background defining plate 92. In the present embodiment, there are available various kinds of suction nozzles 86 which are different in at least one of a diameter of the suction tube 90 (as measured at its suction surface) and a diameter of the background defining plate 92 (that has a circular shape in its plan view), so that one of the suction nozzles 86 is selected depending on the electronic circuit components (that are to be sucked) so as to be used. The suction surface and the background defining plate 92a of the suction nozzle 86a have respective diameters larger than those of the suction surface and the background defining plate 92b of the suction nozzle 88b. The suction nozzle 86a is used to mount large-sized electronic circuit components.

Figure 6:
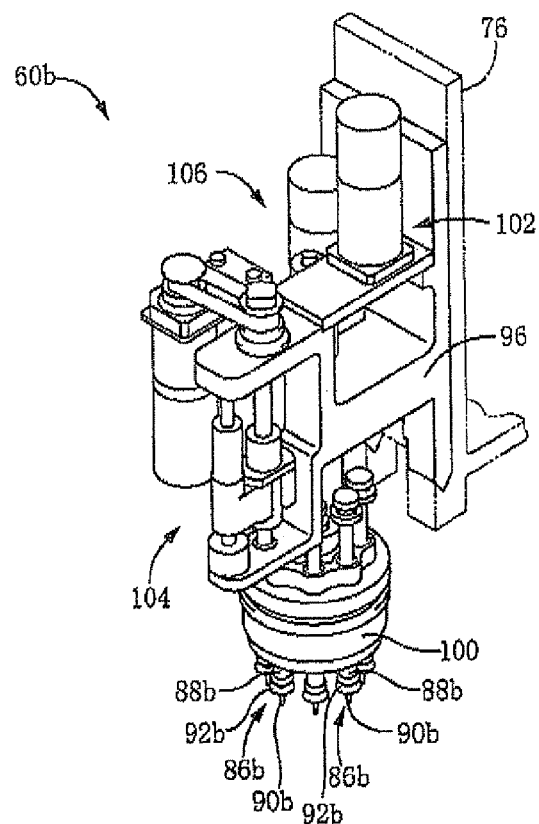
FIG. 6 is a perspective view showing an internal construction of the example of the mounting head shown in FIG. 5B.

In the mounting head 60a, the nozzle holder 88a is vertically movable and rotatable by a movement device (not shown) that is provided in a main body of the mounting head 60a. The movement device serves as an elevating device and a rotating device, and is axially or vertically movable and rotatable about its axis relative to the main body of the mounting head 60a. As shown in FIG. 6, the mounting head 60b is a rotary-type mounting head having has a main body 96, a rotary body 100 which is attached to the main body 96 and which is rotatable about a vertical axis, and a rotating device 102 configured to rotate the rotary body 100 in forward or reverse direction by a desired degree of angle. The twelve nozzle holders 88b are disposed on respective portions of the rotary body 100 that are located in respective twelve positions which lie on a circle (whose center corresponds to the above-described vertical axial) and which are circumferentially spaced apart from each other by a suitable interval. In the present embodiment, the twelve positions are equi-angularly spaced apart from each other in a circumferential direction.

Each of the twelve nozzle holders 88b is rotatable about its axis, and is movable in parallel to the above-described vertical axis relative to the rotary body 100. Each of the suction nozzles 86b is detachably held by a distal end portion of a corresponding one of the nozzle holders 88b, namely, by a lower end portion of the corresponding nozzle holder 88b in a state in which the mounting head 60b is attached to the second X-axis slide 76.

The twelve nozzle holders 88b (each of which is rotatable about its axis, as described above) are rotated about the above-described vertical axis by rotation of the rotary body 100 about the vertical axis, so as to be sequentially positioned in a component suction position (i.e., a component picking position) that corresponds to a predetermined one of twelve stop positions. When each of the nozzle holders 88b is positioned in the component suction position, the nozzle holder 88b is vertically moved by a movement device in the form of an elevating device 104 disposed in a portion of the main body 96 of the mounting head 60b, which portion positionally corresponds to the component suction position. Further, the nozzle holder 88b is rotated about its axis by a holder rotating device 106 that is provided in the main body 96. As shown in FIG. 3, the fiducial-mark-image taking device 28 is mounted on the second X-axis slide 76, and is movable together with the mounting head 60 by the head moving device 62.

Figure 7:
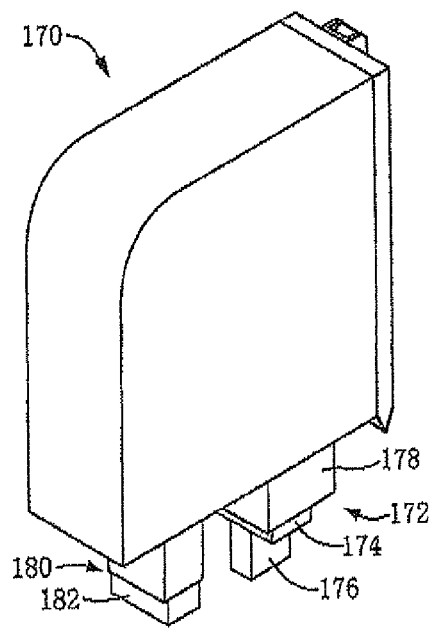
FIG. 7 is a perspective view showing a printing head that is to be used as a substitution of the mounting head.

To the second X-axis elide 76, as shown in FIG. 7, a printing head 170 as a property-related-information providing head can be attached in place of the mounting head 60. In the present embodiment, like a printing head of an inkjet printer, the printing head 170 is configured to eject ink droplets onto a recording object so as to print characters, numbers, signs, figures or the like on the recording object. To this end, the printing head 170 includes a printer 172 vertically movably disposed on a head main body (not shown) and a printer elevating device (not shown) configured to vertically move the printer 172. The printer 172 includes an ink tank 174, an ink ejecting portion 176 and an actuator mechanism 178 that is configured to eject ink droplets formed of ink stored in the ink tank 174, through nozzles provided in the ink ejecting portion 176, for example, by deformation of piezoelectric elements. The nozzles having respective ejection openings are arranged in a single nozzle row or a plurality of nozzle rows. When the printing head 170 is being attached to the second X-axis slide 76, the nozzle row or rows are parallel to the Y-axis direction while the ejection openings of the respective nozzles face downwardly.

The printing head 170 is provided with a barcode reader 180 as an information reading device that is a kind of an information recognizing device, and serves also as an information reading head as an information recognizing head. When the printing head 170 is being attached to the second X-axis slide 76, a reading portion 182 of the barcode reader 180 faces downwardly and is elongated in the X-axis direction. Further, with the printing head 170 being attached to the second X-axis slide 76, the reading portion 182 is positionable in a height position that permits the reading portion 182 to read the barcode printed on the circuit board 57 without interfering with any other components of the mounting module 10. The printing head 170 is detachably attached to the second X-axis slide 76 through an attachment mechanism having the same construction as the above-described attachment mechanism through which the mounting head 60 is attached to the second X-axis slide 76. The mounting module 10 in which the printing head 170 is attached serves as a printing module 10 as a printer that is a kind of property-related information provider, and serves also as an information reading module 10 as an information reader that is kind of a property related information recognizer.

Figure 8:
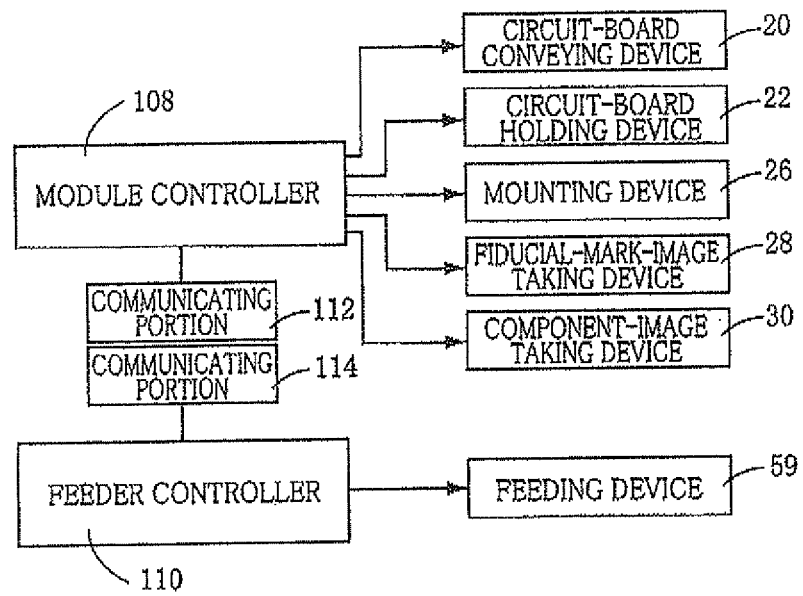
FIG. 8 is a block diagram showing a part of a control system in the mounting module of FIG. 2.

Each mounting module 10 is provided with a module controller 108 as a part of the above-described electric controlling device 32. As shown in FIG. 8, the module controller 108 is configured to control the circuit-board conveying device 20, circuit-board holding device 22, mounting device 26, fiducial-mark-image taking device 28 and component-image taking device 30. Meanwhile, each feeder 58 is provided with a feeder controller 110 that is configured to control the feeding device 59, as shown in FIG. 8. The module controller 108 and the feeder controller 110 are constituted principally by respective computers, and are held in communication with each other via the above-described communicating portion 112 provided in the holding portion 156 of the holding base 150 and the above-described communicating portion 114 provided in the feeder 58, so that various informations can be supplied from one of the two controllers 108, 110 to the other of the two controllers 108, 110. Where the printing head 170 is being attached to the second X-axis slide 76, the printing head 170 is controlled by the module controller 108 to print and read the barcode.

Figure 9:
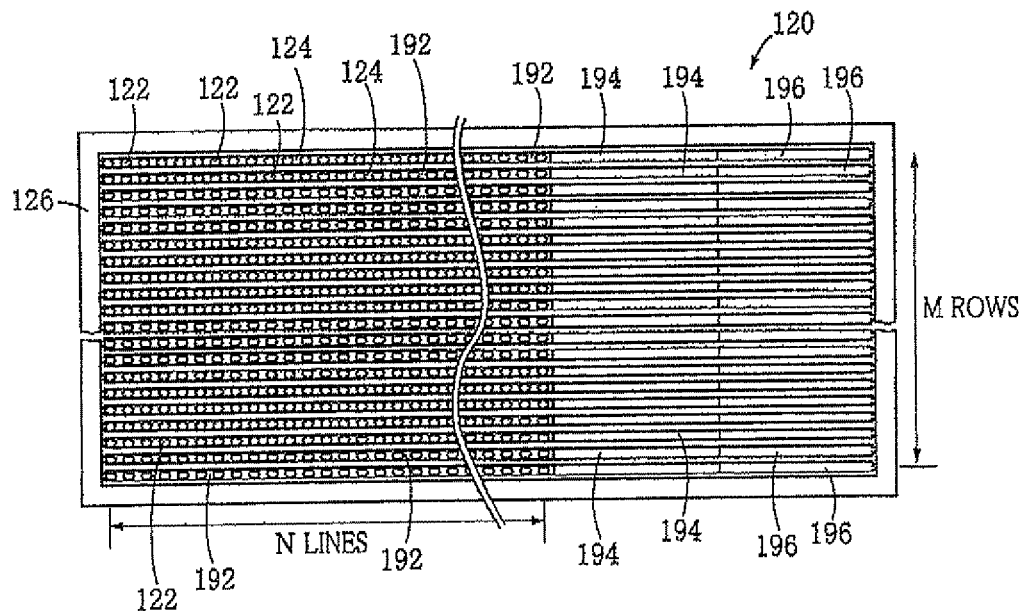
FIG. 9 is a view showing a surface of a backlight as an example of an electronic circuit that is to be assembled in the electronic-circuit assembling process.

In the present embodiment, a backlight for personal computer display is assembled by mounting a multiplicity of light emitting diodes (hereinafter referred to as "LEDs") 122 as a kind of different-property components onto a multi-piece substrate 120 as shown in FIG. 9, by operations of the assembling system constructed as described above. The multi-piece substrate 120 is constituted by a total of M pieces of elongated substrate pieces 124 that are connected to one another via a frame portion 126. Onto a surface of each substrate piece 124, a total of N pieces of LEDs 122 having the same brightness level are to be mounted to be arranged in a single row. That is, on an entirety of the multi-piece substrate 120, the LEDs 122 are arranged in M rows and N lines at a constant pitch in both of the row and line directions, such that the LEDs 122 arranged in each of the M rows are required to have the same brightness level. After the LEDs 122 have been mounted onto the multi-piece substrate 120, the multi-piece substrate 120 are divided into M pieces of LED bars by cutting off the frame portion 126. The brightness level of the LEDs 122 in any one of the LED bars have to be constant or uniform over an entirety of the LED bar, although the brightness level of the LEDs 122 in any one of the LED bars may be different from that of the LEDs 122 in the others of the LED bars.

The brightness of the LED 122 upon supply of a rated current thereto is inevitably variable depending on a condition of environment (e.g., temperature and humidity) at which the LED 122 is manufactured. In view of this, after having been manufactured, the LEDs 122 are sorted into a plurality of groups of respective different brightness levels (e.g., 100 levels), so that the LEDs 122 sorted into the same group and having the same brightness level are stored in a single carrier tape. The carrier tape storing the LEDs 122 of the same brightness level is wound on a single reel 140 (see FIG. 2), and is a product that is to be distributed to a market. In the present embodiment, the reel 140 is provided with a barcode 142 representing information including the type and brightness level of the LEDs 122 stored in the carrier tape that is wound on the same reel 140. Further, in the present embodiment, the information represented by the barcode 142 includes also a reel identifier in the form of a reel ID of the reel 140 and a number of the LEDs 122 stored in the carrier tape as a new carrier tape. The feeder 58 is provided with a barcode 144 representing information including at least a feeder identifier in the form of a feeder ID of the feeder 58. The reel ID corresponds to a component-holding-member-identification-related information, while the feeder ID corresponds to a component-supplier-identification-relate information.

As described above, all the LEDs as the electronic circuit components mounted onto the multi-piece substrate 120 are the same in kind and type but are different in brightness level at a plurality of levels. Since the brightness of the backlight has to be constant or uniform over its entire surface, the LEDs 122 of the same brightness level are mounted onto each of the substrate pieces 124, and the electric currents supplied to the LEDs 122 are controlled through resistors, so that the brightness values of the LEDs 122 constituting the entirety of the backlight can be equal to one another. In general, a backlight manufacturer is required to manufacture a backlight by using the LEDs 122 which are available to the manufacturer and which are likely to be different in the brightness value at a plurality of different levels. There will be described a case with conditions that (1) the number of the available LEDs 122 is larger than a number of LEDs 122 required for a certain number of the backlights that are projected to be manufactured, (2) the available LEDs 122 are different in the brightness level at a plurality of different levels, (3) the available LEDs 122 are sorted into a plurality of groups depending on the brightness level, and the LEDs 122 having the same brightness level and sorted into the same group are stored together with one another, and (4) the number of the LEDs 122 of each group is known.

In the present embodiment, as shown in FIG. 9, the LEDs 122 are mounted onto the surface of each of the M pieces of substrate pieces 124 of the multi-piece substrates 120, and at least one resistor 190 (see FIG. 10) as at least one associated component, which is to be associated with the mounted LEDs 122, is also mounted on the surface of the substrate piece 124. In addition, a barcode representing information related to the substrate piece 124 is printed on the surface of the substrate piece 124. In the present embodiment, the LEDs 122 are mounted in an area within each of the substrate pieces 124, wherein this area corresponds to a LED mount area 192 as a predetermined different-property-component mount area onto which the different-property components having the same electrical property value are to be mounted. Thus, the number of the LED mount areas 192 provided on the multi-piece substrate 120 as a single circuit board is M. In the present embodiment, the surface of each substrate piece 124 is sectioned into the LED mount area 192, a resistor mount area 194 and a barcode print area 196 which are constituted by respective portions of the surface of the substrate piece 124. The resistor mount area 194 serves as an associated-component mount area in which the resistor or resistors 190 are to be mounted. The barcode print area 196 serves as a barcode provision area as a kind of an information record area or a property-related information provision area. The information related to each substrate piece 124 includes at least the brightness level of the LEDs 122 mounted onto the same substrate piece 124. In the present embodiment, the brightness level corresponds to the electrical property value, and the brightness level as such serves as a property-related information by which the electrical property value or level of the LEDs 122 are recognizable. The barcode printed in the barcode print area 196 represents particular informations, so that the substrate piece 124 is provided with the brightness level of the LEDs 122, by printing of the barcode in the barcode print area 196. It is noted that the property-related information may be include, in addition to the information related to the brightness level, information representing an identification number of the substrate piece 124, for example.

Figure 10A:
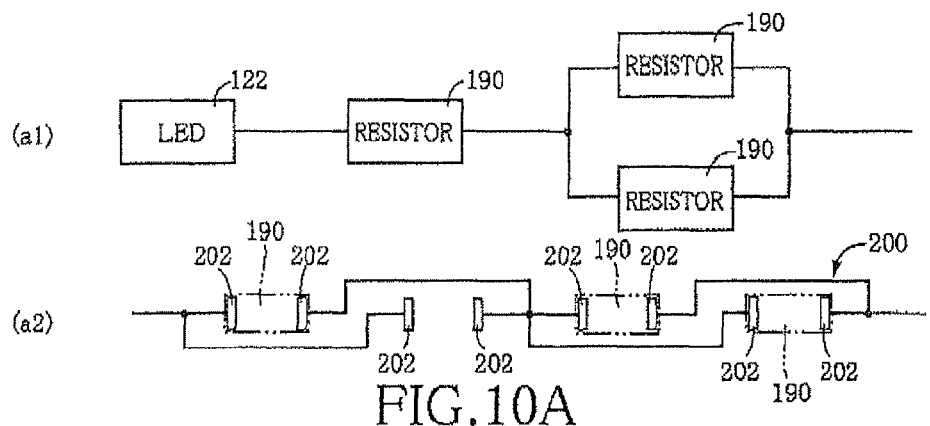
FIGS. 10A, 10B, 10C, 10D are set of views each schematically showing a diagram of a resistor circuit and also an arrangement of resistors for establishing the resistor circuit.
Figure 10B:
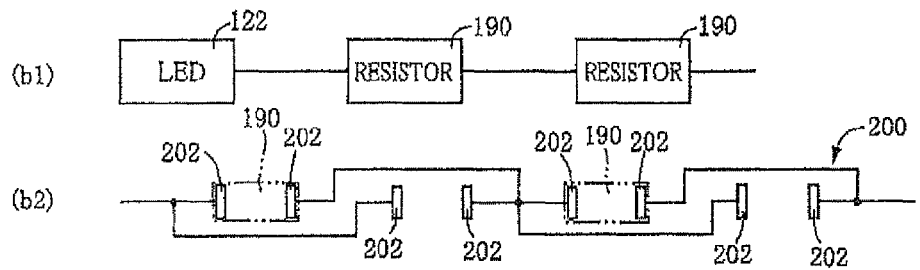
Figure 10C:
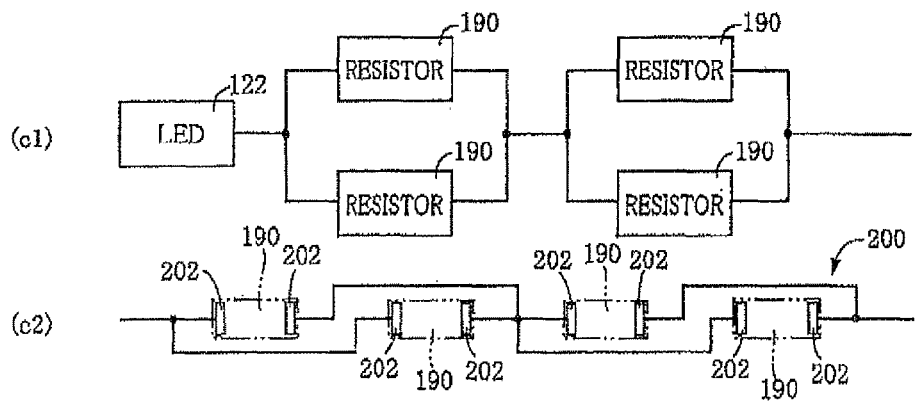
Figure 10D:
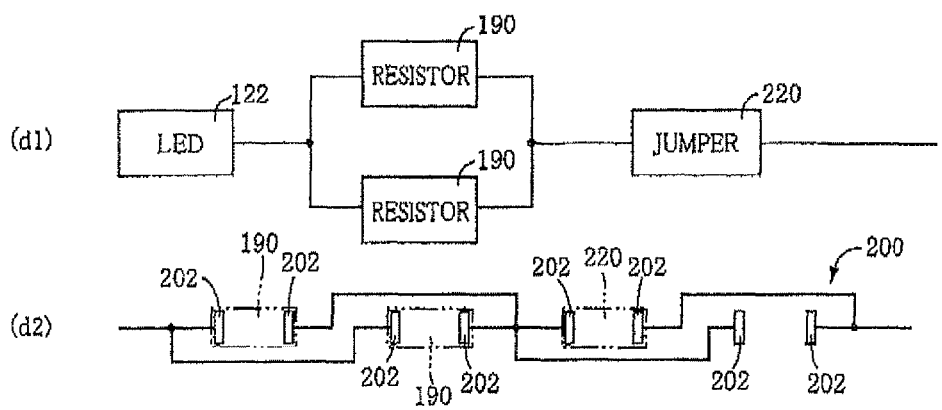

In the resistor mount area 194 of each of the M pieces of substrate pieces 124, there is formed a resistor circuit 200 (in which the resistors 190 are to be provided), as partially shown in (a2) of FIG. 10A. The resistor circuit 200 has a plurality of connection terminals 202 which are arranged such that the provided resistors 190 can be connected in series and/or parallel with one another.

The resistors 190 consist of a plurality of kinds of resistors that different from one another in resistance value at a plurality of levels. Therefore, similarly with the LEDs 122, the resistors 190 are sorted into a plurality of groups of respective different resistant values, so that the resistors 190 sorted into the same group and having the same resistance value are stored in a single carrier tape. The carrier tape storing the resistors 190 of the same resistance value is wound on the single reel 140. Each reel 140 is provided with the barcode 142 representing information including the type and resistance value of the resistors 190 stored in the carrier tape that is wound on the same reel 140. Further, in the present embodiment, the information represented by the barcode 142 includes also a reel identifier in the form of a reel ID of the reel 140. The resistance value corresponds to the electrical property value of the associated component, and serves as the property-related information by which the electrical property value of the resistors 190 are recognizable.

In the present embodiment, the printing of the barcode and the mounting of the resistors 190 onto the substrate piece 124 are carried out, following the mounting of the LEDs 122 onto the substrate piece 124, in the mounter liner 5. To this end, in the present embodiment, among a plurality of mounting modules 10 (e.g., eight mounting modules 10) constituting the mounter line 5, the downstream-most mounting module 10 is assigned to mount the mount the resistors 190 onto the substrate piece 124, the mounting module 10 adjacent to the downstream-most mounting module 10 is assigned to serve as the printing module 10, and the other six mounting modules 10 are all, assigned to mount the LEDs 122 onto the substrate piece 124.

In a stage in which the LEDs 122 are mounted onto each substrate piece 124 of the multi-piece substrate 120, it may be considered that the multi-piece substrate 120 is an ordinary substrate rather than a multi-piece substrate and that the LEDs 122 of M rows and N lines are mounted onto the substrate. However, in this stage, there is a requirement that the LEDs 122 arranged in each of the M rows have to be the same to each other with respect to the brightness level. Further, in order to enable the mounting work, which are shared by the plurality of mounting modules 10, to be carried out in a minimum cycle time with maximum throughputs, it is desirable that the mounting modules 10 are assigned to work for the same number of rows, and that, if the number M of the rows is a number indivisible by the number of the mounting modules 10, one of the mounting modules 10 is assigned to work for a smaller number of rows, which is smaller than a number of rows assigned by each of the other mounting modules 10.

Where there are a large number of LEDs 122 having the same brightness level, it is desirable that the LEDs 122 of the same brightness level are mounted by the same mounting module 10 as many as possible, in order to reduce the number of change of the brightness level, as described below. Further, it is desirable that, if all the LEDs 122 having the same brightness level cannot be mounted by the same mounting module 10, the LEDs 122 are mounted by the mounting modules 10 adjacent to each other. Moreover, in such a case, it is desirable that some of the adjacent LEDs 122 are mounted by an upstream one of the adjacent mounting modules 10 and then the other LEDs 122 are mounted by a downstream one of the adjacent mounting modules 10.

Further, since only one feeder 58 rather than two or more feeders 58 is operable to supply the LEDs 122 at the same stage in each one of the mounting modules 10, it might be considered that a plurality of feeders 58 do not have to be constantly installed on each mounting module 10 as long as only one feeder 58 is constantly installed on the mounting module 10. However, a plurality of feeders 58 may be installed on the mounting module 10, for enabling switching from one of the feeders 58 into another of the feeders 58, for example, when the number of the LEDs 122 remaining in the one of the feeders 58 becomes smaller than the number of the LEDs 122 that are required to be mounted on a single row. This arrangement is desirable for reducing the number of times at which the operator is required to perform a manual operation for installation of the feeders 58 onto the mounting module 10.

Further, in order to increase efficiency of the mounting work by the mounting module 10, it is desirable that the plurality of feeders 58 are installed in respective holding-portion positions that minimize a distance by which each LED 122 is to be carried by the mounting head 60, and it is desirable to employ, as the mounting head 60, the mounting head 60b holding the plurality of suction nozzles 86b (e.g., twelve suction nozzles 86b).

In the following description, the attachment of the reel 140, on which the carrier tape holding the LEDs 122 (or resistors 190) as the electronic circuit components is wound, to the feeder 58 will be referred to as "mounting", while the attachment of the feeder 58 onto the holding base 150 holding portion 156) of the component supplying device 24 will be referred to as "installation". Further, in the following description, there will be used also an abbreviated expression that "the LEDs 122 (or resistors 190) are installed on the holding base 150, component supplying device 24 or mounting module 10", where appropriate.

Figure 11:
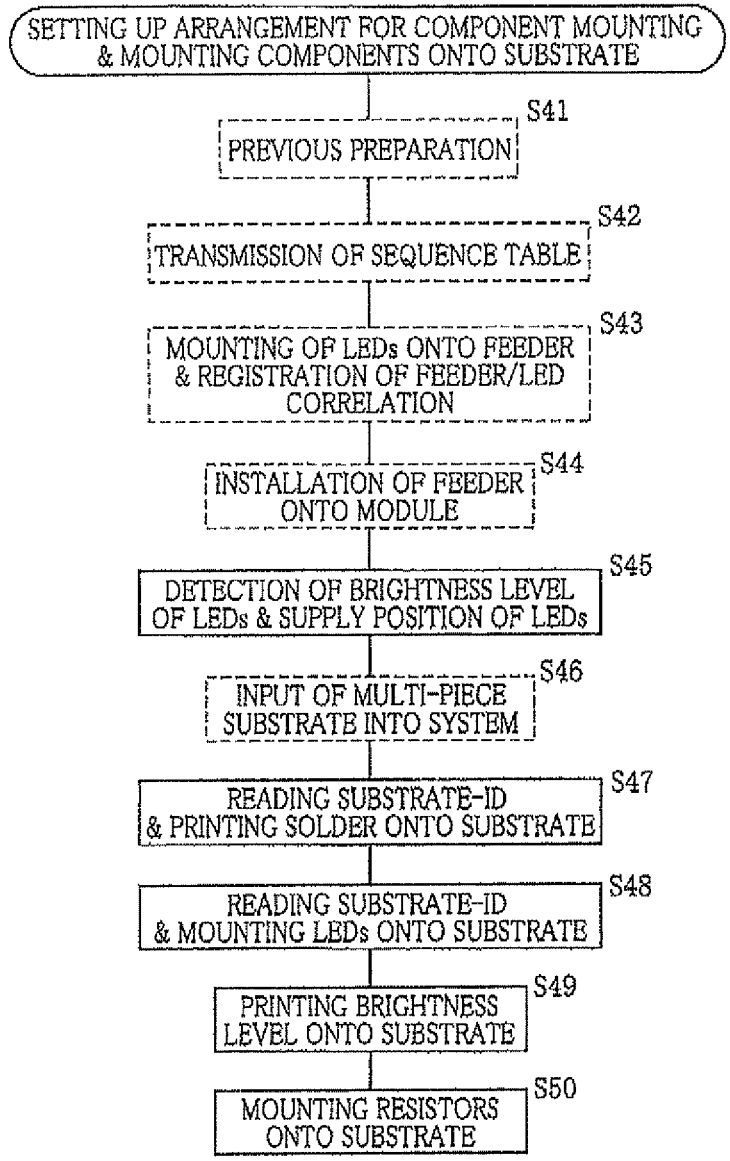
FIG. 11 is a flow chart showing an operation flow according to the electronic-circuit assembling process.

In the present embodiment, the operator mounts the reel 140 holding the LEDs 122, onto the feeder 58, and then installs the feeder 58 onto a randomly selected one of the holding portions 156 of the holding base 150 of a randomly selected one of the mounting module 10. After the manual operations have been thus carried out by the operator, the backlight is assembled in a manner dependent on the LEDs 122 actually installed on the mounting module 10. There will be described a process of assembling the backlight, by way of example, with reference to FIGS. 11-15. FIG. 11 is a flow chart showing an operation flow carried out for principally setting up an arrangement required for assembling the backlight. In FIG. 11, steps indicated by broken lines are steps that are to be implemented manually by the operator or implemented by the assembling system in accordance with commands supplied from the operator, while steps indicated by solid lines are steps that are to be implemented automatically by the assembling system.

The operation flow of FIG. 11 is initiated with step S41 that is implemented to carry out a previous preparation, by using a personal computer 7, for creating a part of a sequence table that is to be used for mounting the LEDs 122 of M rows and N lines onto the multi-piece substrate 120.

The module controller 108 of each mounting module 10 stores therein a standard mounting program that is to be used commonly for all kinds of electronic circuit assembling works, namely, that is to be used for perform standard controls of the mounting module 10, so as to receive the electronic circuit components from the component supplying device 24 and mount the components onto the circuit board held by the circuit-board holding device 22. In most cases, this standard mounting program is used in combination with a mount data (described below) so as to serve as a particular mounting program for controlling assembling of a particular electronic circuit. In the present embodiment, a backlight assembling routine designed for mounting the LEDs 122 onto the multi-piece substrate 120 is added to the standard mounting program, so as to constitute a basic backlight-assembling control program, and this basic backlight-assembling control program is used in combination with the mount data and correlation data (described below), so as to serve a particular backlight-assembling control program. To this end, various kinds of data are created for each mounting module 10. The mount data includes the sequence table shown in FIG. 12 and a device table shown in FIG. 13. The backlight assembling routine may be created by an user. However, in the present embodiment, the backlight assembling routine is created by the manufacturer and is stored in a control device.

FIG. 12 shows, by way of example, the sequence table shows a series of mounting operations that are to be sequentially executed. In the sequence table in which the mounting operations are listed in order of the execution, "SUBSTRATE PIECE NUMBER" represents a number of the substrate piece as a kind of name of the mount area in which the component is to be mounted by each mounting operation, "COORDINATE" represents a mount position (X, Y coordinate) in which the component is to be mounted, and "SLOT NUMBER" represents the install position or component supply position. The sequence table correlates between each substrate piece (each mount area) and the corresponding mount-position group that is constituted by a plurality of mount positions within the substrate piece. In the present embodiment, a plurality of mount-position groups are set on the circuit board. Further, in the present embodiment, each one of the mounting modules 10 is assigned to mount the LEDs 122 onto a corresponding one of the substrate pieces of each multi-piece substrate 120. In the present embodiment, since the feeder 58 on which the reel 140 is mounted is a randomly selected one of the holding portion 156 of the holding base 150, the install position is not yet determined in the stage of the previous preparation, so that, as a part of the sequence table, a date representing a correlation among the "SUBSTRATE PIECE NUMBER", "SEQUENCE NUMBER" and "COORDINATE" is created. In this stage, the device table is not created. This data representing the correlation among the "SUBSTRATE PIECE NUMBER", "SEQUENCE NUMBER" and "COORDINATE" is created as a common data that is common to all the multi-piece substrates 120 onto which the LEDs 122 are to be mounted in the mounting modules 10.

Thereafter, in step S42, the sequence table is transmitted to the host computer 8, and is then transmitted from the host computer 8 to the mounting modules 10 and optionally to the other component apparatuses that cooperate with the module line 5 to constitute the assembling system. Next, in step S43, the operator mounts the reel 140 storing the LEDs 122, on a randomly selected one of the feeders 58. In this instance, the operator causes the barcodes 142, 144 provided on the respective reel 140 and feeder 58, to be read by a barcode reader 210 (see FIG. 1). This barcode reader 210 is connected to the personal computer 7, the host computer 8 or another computer, so that the connected computer creates a feeder/LED correlation table that correlates between the brightness level of the LEDs 122 stored by the reel 140 and the feeder ID of the feeder 58. The created feeder/LED correlation table is transmitted to the module controller 108 of each mounting module 10 that is assigned to mount the LEDs 122 onto the corresponding substrate piece. The transmitted feeder/LED correlation table is stored in a memory of the computer of the module controller 108. The information obtained by the feeder/LED correlation table is a component-supplier/different-property-component correlation-related information.

Further, the above-described connected computer (to which the barcode reader 210 is connected) creates also a reel/feeder correlation table that correlates between the reel ID and the feeder ID. The created reel/feeder correlation table is also transmitted to the module controller 108.

Next, in step S44, the operator installs the above-described feeder 58 in a randomly selected one of the holding portions 156 of a randomly selected one of the mounting modules 10. Step S44 is followed by step S45 in which the module controller 108 of the randomly selected mounting module 10 detects the install position in which the LEDs 122 have been installed and also the brightness level of the installed LEDs 122. Since the module controller 108 of the randomly selected mounting module 10 obtains the feeder ID of each feeder 58 through the communication between the above-described communicating portions 112, 114, the module controller 108 of the randomly selected mounting module 10 can determine which one of the feeders 58 has been installed in which one of the install positions. Thus, based on information related to this determination, the above-described feeder/LED correlation table (previously obtained and stored in the memory) and the obtained feeder ID, it is possible to detect or automatically obtain a different-property-component-related information including the brightness level of the LEDs 122 and the install position of the feeder 58 that is to supply the LEDs 122 (i.e., the different-property-component supply position from which the LEDs 122 is to be supplied). The thus obtained different-property-component-related information is stored in memory means in the form of the memory of the computer. Further, the module controller 108 teaches the feeder controller 110 an initial component amount that is the number of the LEDs 122 initially stored in the feeder 58, via the communication between the communicating portions 112, 114, and the feeder controller 110 stores therein the initial component amount as a remaining component amount at an initial stage. When the carrier tape is a new one, the number of the LEDs 122 stored in the carrier tape corresponds to the initial component amount, i.e., the remaining component amount at an initial stage.

As described above, the module controller 108 of the randomly selected mounting module 10 can determine the install position from which the LEDs 122 are to be supplied and also the brightness level of the supplied LEDs 122, so that the operator can install the feeder 58 into a randomly selected one of the install position. However, it is desirable that the operator takes account of matters that are inherent to the mounting of the LEDs 122, when mounting the reel 140 onto the feeder 58 and installing the feeder 58 onto the mounting module 10. In the present embodiment, it is not essential that the feeder 58 is installed in accordance with a specific manufacturing plan prepared in advance, so that the backlight can be manufactured advantageously in a manner flexible and variable depending on situation changes.

Where there are a plurality of feeders that are arranged to supply the LEDs 122 of the same brightness level, such plurality of feeders may be installed in respective install positions. In the present embodiment, the regions for installation of the feeders 58 are predetermined such that the predetermined install regions are suitable for increasing efficiency of the mounting work by the mounting module 10. Further, in order to facilitate determination of a first one of the feeders 58 from which the LEDs 122 are to be taken in each mounting module 10 upon initiation of the assembly of backlights of each manufacturing lot, the first one of the feeders 58 is installed in a predetermined one of the install position. The other feeders 58 which are to supply the same LEDs 122 are installed in the other install positions that are adjacent to the install position of the first feeder 58.

With the above rule relating to the installation of the feeders 58, the LEDs 122 of a randomly selected one of the brightness levels are installed on a randomly selected one of the holding portions 156. In the present embodiment, the plurality of feeders 58 arranged to supply the LEDs 122 are installed on each of the mounting modules 10, and all of the LEDs 122 supplied from the plurality of feeders 58 have the same brightness level in some of the mounting modules 10 while all of the LEDs 122 supplied from the plurality of feeders 58 do not have the same brightness level in the other of the mounting modules 10.

The mount data is created by automatically adding data of "SLOT NUMBER" into the sequence table of FIG. 12 and creating the device table of FIG. 13, based on results of detection of the different-property-component-related information (install positions) of the LEDs 122. The device table of FIG. 13 correlates between each "SLOT NUMBER" and the corresponding "LED" as a "COMPONENT NAME". The "COMPONENT NAME" is represented actually by a model number, and data indicative of shape and dimensions of each LED 122 as data defining contour of each electronic circuit component is read out from the database stored in the host computer 8, based on the model number. The read data indicative of shape and dimensions of the LED 122 is used when the image of the LED 122 is taken by the component-image taking device 30 and when an error of position of the LED 122 held by the suction nozzle 86 is obtained. Thus, the data indicative of the "COMPONENT NAME" corresponds to the data defining the contour of the LED 122, and the "COMPONENT NAMES" of the LEDs 122 are the same to one another, irrespective of whether the brightness levels of the respective LEDs 122 are the same to one another or different from one another.

Onto the mounting module 10 assigned to mount the resistors 190 onto the substrate piece 124, the resistor 190 are installed by the operator. The installation of the resistors 190 is made in the same manner as the installation of the LEDs 122 onto the mounting modules 10. The operator operates the barcode reader 210 to read the barcode 142 provided on a randomly selected one of the reels 140 storing the resistors 190 and also the barcode 144 provided on a randomly selected one of the feeders 58, and then mounts the randomly selected reel 140 onto the randomly selected feeder 58. Upon mounting of the randomly selected reel 140 onto the randomly selected feeder 58, the personal computer 7, host computer 8 or another computer creates a feeder/resistor correlation table that correlates between the resistance value of the resistors 190 stored by the reel 140 and the feeder ID of the feeder 58. The created feeder/resistor correlation table is transmitted to the module controller 108 of the downstream-most one of the mounting modules 10, and is then stored in the memory of the computer of the module controller 108. The information obtained from the feeder/resistor correlation table is a component-supplier/associated-component correlation-information. Then, the operator installs the feeder 58 (on which the reel 140 is mounted) onto a randomly selected one of the holding portions 156 of the holding base 150 of the downstream-most mounting modules 10. Upon installation of the feeder 58 onto the randomly selected one of the holding portion 156, the module controller 108 of the downstream-most mounting modules 10 detects which one of the install positions the resistors 109 have been installed into and also which one of the resistance values the installed resistors 109 have, so that the module controller 108 obtains an associated-component-related information including the supply position and resistance value of the resistors 109.

The operator estimates or calculates, based on the brightness level of the LED 122 on hand, the resistance value required for controlling the electric current that is to be supplied to the LED 122, and then install the resistors 190 having the required resistance value, onto the holding base 150. The resistance value required for establishing uniformity in the brightness of the LEDs 122 can be obtained by a single resistor 190 in some case, and can be obtained by a combination of a plurality of resistors 190 in other case. Therefore, the operator installs the resistors 190 of a plurality of kinds (which are expected to be used) onto the holding base 150. In this instance, it is desirable to install, onto the holding base 150, a plurality of feeders 58 holding the resistors 190 of at least one kind, a large amount of which are expected to be used. Further, although each feeder 58 holding the resistors 190 may be installed, basically, onto a randomly selected one of the holding portions 156, it is desirable to install each feeder 58 in such a position that maximizes efficiency of the mounting work by the mounting module 10. To this end, for example, the feeder or feeders 58 supplying the resistors 190 of the kind that is to be used more frequently than the resistors 190 of the other kinds, are mounted preferably in a position or positions close to the resistor mount area 194 within the substrate piece 124 of the multi-piece substrate 120 held by the circuit-board holding device 22, namely, in the position or positions substantially aligned with the resistor mount area 194 in a direction parallel to in the circuit-board conveyance direction.

After the set-up works have been completed as described, the mount works for mounting the multiplicity of LEDs 122 onto the multi-piece substrate 120 are carried out by the mounter line 5. In the present embodiment, the multi-piece substrate 120 has a size that permits the substrate 120 to be held by each one of the mounting module 10 and to be subjected to the mount work carried out by the same mounting module 10, and is to be conveyed while taking such a posture that causes a longitudinal direction of the substrate piece 124 to be parallel to the conveyance direction. In step S46, the operator inputs the multi-piece substrate 120 provided with the substrate ID, into the substrate ID reading unit 1. Then, in step S47, the substrate ID of the substrate 120 is read by the substrate ID reading unit 1, and the cream solder is printed onto the substrate 120, with a pattern in accordance with the read substrate ID, by operation of the solder printer 3. In the present embodiment, the transmission of the substrate ID from the substrate ID reading unit 1 to a controller of the solder printer 3 is made via the host computer 8, although it can be made directly from the reading unit 1 to the controller of the solder printer 3. The other information transmission between the other component apparatuses also may be made either directly therebetween or indirectly via the host computer 8.

After the cream solder has been printed onto the multi-piece substrate 120, the substrate 120 is conveyed to the substrate ID reading unit 4 so that the substrate ID is read again by the substrate ID reading unit 4. Although the substrate ID obtained by the substrate ID reading unit 1 can be used in the mounter line 5, the substrate ID is read again in the present embodiment, because the multi-piece substrate 120 could be taken out from the component apparatuses such as the substrate ID reading unit 1 and solder printer 33 after the substrate ID has been read by the substrate ID reading unit 1. After the substrate ID has been read by the substrate ID reading unit 4, step S48 is implemented to mount the LEDs 122 rate the multi-piece substrate 120, based on the above-described basic backlight-assembling control program and the mount data created in step S45.

Figure 15:
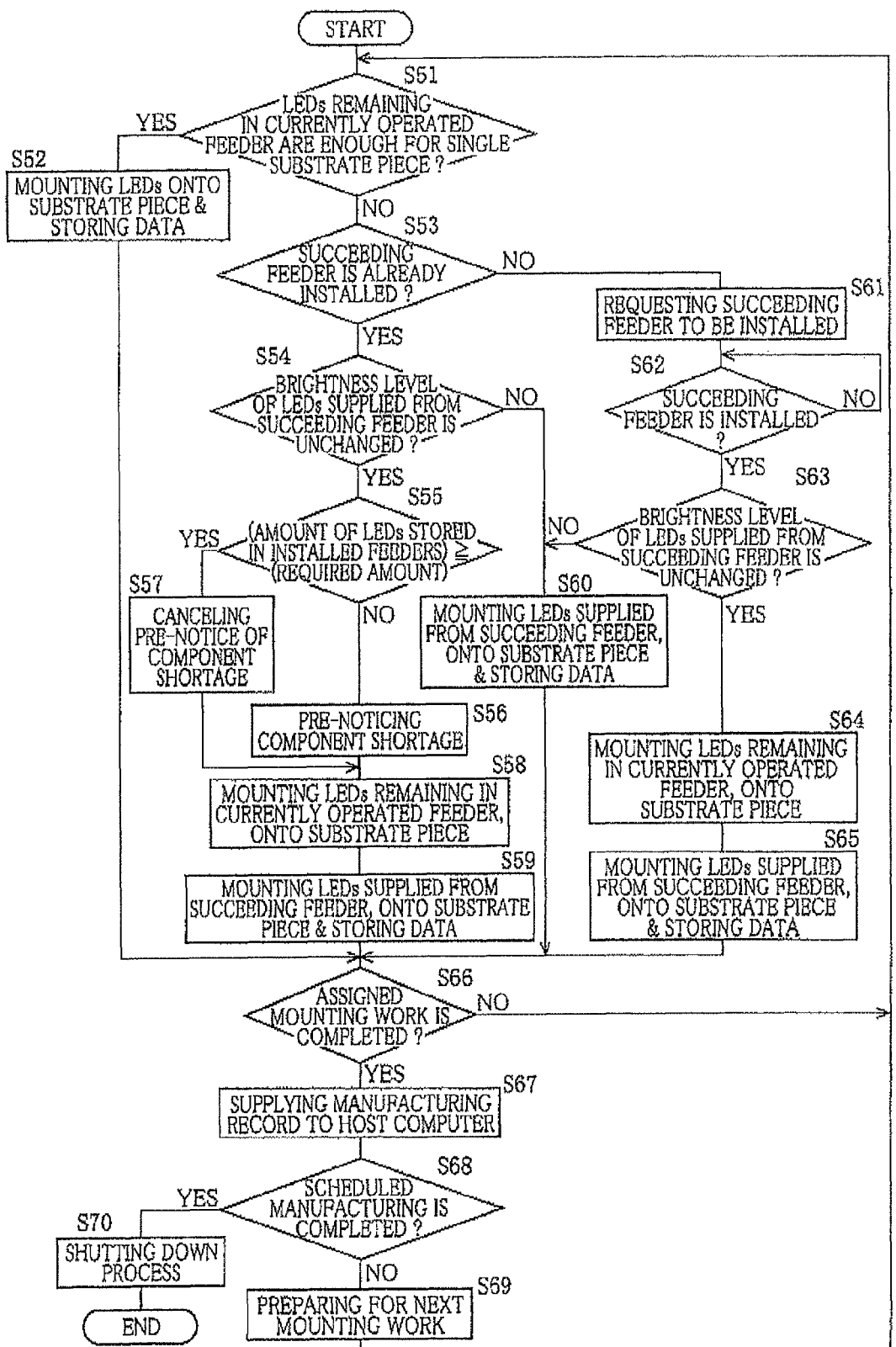
FIG. 15 is a flow chart showing a part of a mounting program that is to be stored in a module controller, for executing another part of the operation flow.

For carrying out the mounting work, the basic backlight-assembling control program is used. FIG. 15 is a flow chart of a part of the basic backlight-assembling control program, which is related to supply of the electronic circuit components and which is constituted principally by the above-described backlight assembling routine. During assembly of the backlight, prior to mounting of the LEDs 122 onto each substrate piece 124, step S51 is implemented to judge whether the mounting of the LEDs 122 onto the entirety of the single substrate piece 124 can be completed by the LEDs 122 remaining in the feeder 58 that is currently supplying the LEDs 122. If a positive judgment (YES) is obtained in step S51, the control flow goes to step S52 in which the mounting of the LEDs 122 is carried out with supply of the LEDs 122 from the same feeder 58, and a data correlating between the number of the substrate piece 124 and the brightness level as a part of a manufacturing record information is stored in memory means in the form of the memory of the computer of the module controller 108. The data correlating between the number of the substrate piece 124 and the brightness level may be, for example, indicative of correlation among the name of the basic backlight-assembling control program, the substrate (multi-piece substrate) ID, the brightness level and the number of the substrate piece 124. The mounting is carried out in accordance with the sequence data, and the mounting head 60 is moved to one of the holding portions 156 which is specified by the "SLOT NUMBER", so as to take the LED 122 from the feeder 58 and mount the feeder 58 into a given position within the substrate piece 124. It is noted that the brightness level included in the manufacturing record information is obtained from the different-property-component-related information stored in the memory.

The above-described data (indicative of correlation between the number of each substrate piece 124 and the brightness level), which is included in the manufacturing record information, is a data correlating between each mount-position group (constituted by the plurality of mount positions) and the brightness level of the different-property components, which are to be correlated with the mount-position group, namely, which are to be mounted in the mount-position group, and constitutes a substrate-piece/brightness-level correlation data for each circuit board. Further, the above-described data is obtained in correlation with the substrate ID for each circuit board. The substrate-piece/brightness-level correlation data may be constituted by a substrate-piece/brightness-level correlation table, as shown by way of example in FIG. 14, which is created for a substrate identification code (substrate ID) of each multi-piece substrate 120, and which correlates between the number n ("SUBSTRATE PIECE NUMBER") of each substrate piece 124 and the brightness level ("BRIGHTNESS LEVEL") of the LEDs 122 mounted on the same substrate piece 124. Thus, through the "SUBSTRATE PIECE NUMBER", a correlation between the mount-position group of each substrate piece 124 in the sequence table and the brightness level in the substrate-piece/brightness-level correlation data is established. The substrate-piece/brightness-level correlation table of FIG. 14 shows a case where the LEDs 122 to be mounted onto a single multi-piece substrate 120 have two brightness levels. However, there is a case where all the LEDs 122 to be mounted onto a single multi-piece substrate 120 have the same brightness level, and also there is a case where the LEDs 122 to be mounted onto a single multi-piece substrate 120 have three or more brightness levels.

It is noted that the substrate-piece/brightness-level correlation data as a mount-position-group/property-related-information correlation data may be created apart from the manufacturing record information, for example, upon installation of each feeder onto the holding base 150. Since the brightness level of the LEDs 122 supplied by the feeder can be obtained upon installation of the feeder onto the holding base 150, it is possible to create, in advance, a correlation table correlating between the number of each substrate piece and the brightness level, so that the "SLOT NUMBER" in the sequence table is determined based on this correlation table created in advance. When an actual brightness level of the LEDs 122 actually mounted on the substrate piece is different from the brightness level of this correlation table, the brightness level of this correlation table is changed or updated to the actual brightness level.

When each one of the LEDs 122 is mounted onto the multi-piece substrate 120, the number of the remaining components memorized in the feeder controller 110 is reduced by one. This number of the remaining components is supplied from the feeder controller 110 to the module controller 108, and the above-described judgment of step S51 is made based on the supplied number of the remaining components. Upon completion of the component mounting work carried out for the circuit board 57, the number of the remaining components is supplied from the feeder controller 110 to the module controller 108, and is stored as a data correlated to the reel ID. By correlating the number of the, remaining components with the reel ID, the number of remaining components (i.e., the number of the LEDs 122 remaining in the feeder 58) is given as the initial component amount to the feeder controller 110 that is configured to the feeder 58 installed on the holding base 150.

In the present embodiment, in the event of failure in mounting of one of the LEDs 122 by the suction nozzle 86b of the mounting head 60b, a recovery operation is executed for compensating the failure, so that another one of the LEDs 122 is additionally consumed each time the recovery operation is executed. Therefore, the number of the remaining components is reduced by one, upon execution of the recovery operation.

The above-described judgment of step S51 (as to whether the mounting of the LEDs 122 onto the entirety of a single substrate piece 124 can be completed by the LEDs 122 remaining in the feeder 58) can be made, in principle, by comparing the required number N of the LEDs 122 (that are to be required to be mounted onto the single substrate piece 124) with the number of the remaining components. However, in the present embodiment in which the above-described recovery operation is executed, a positive judgment (YES) is obtained in step S51, when the number of the remaining components is larger than a sum of the required number N and an additional number that is determined depending on a possible frequency of execution of the above-described recovery operation.

When a negative judgment (NO) is obtained in step S51, the control flow goes to step S58 that is implemented to judge whether or not there is another feeder 58 that is installed on the holding base 150, namely, judge whether or not there is installed another feeder 58, which is ready for supplying the LEDs 122, as a feeder succeeding the currently operated feeder 58 in which the number of the remaining LEDs 122 becomes insufficient for completing the mounting of the LEDs 122 onto the single substrate piece 124. When a positive judgment (YES) is obtained in step S53, step S54 is implemented to judge whether or not the brightness level of the LEDs 122 that to be supplied by the succeeding feeder 58 is the same as that of the LEDs 122 supplied by the currently operated feeder 58. In the present embodiment, the operator is scheduled to mount the LEDs 122 into a vacant install position at a randomly selected stage, so that the brightness level of the LEDs 122 that is to be supplied by the succeeding feeder 58 is not necessarily the same as that of the LEDs 122 supplied by the currently operated feeder 58, where the plurality of feeders 58 are installed on the mounting module 10. Like in the above-described set-up work, in the installation of the feeder 58 carried out at the randomly selected stage, the feeder/LED correlation table is created and is then transmitted to the module controller 108, so that the different-property-component-related informations of the LEDs 122 (that are to be supplied from the succeeding feeder 58) are detected together with determination of the install position in which the succeeding feeder 58 is installed and determination as to which one of the feeders 58 is installed as the succeeding feeder 58. The determination of step S54 is made based on all of the detected different-property-component-related informations. Further, each time when the feeder 58 is mounted onto the mounting module 10 by the operator, the above-described device table of FIG. 13 is updated.

When a positive judgment (YES) is obtained in step S54, namely, when the feeder 58 is installed on the same mounting module 10 with the installed feeder 58 being to supply the LEDs 122 whose brightness level is the same as the currently supplied LEDs 122, the control flow goes to steps S55-S59 that are implemented to preliminarily notice shortage of the components, mount the LEDs 122 (having the same brightness level and supplied from the two feeders 58) onto the multi-piece substrate 120, and store data related to record the manufacturing record. Specifically described, step S55 is implemented to judge whether a total number p of the LEDs 122 having the same brightness level and stored in all the feeders 58 installed on the mounting module 10 is equal to or larger than a predetermined number P. When a negative determination (NO) is obtained in step S55, the control flow goes to step S56 to preliminarily notice the component shortage. When a positive determination (YES) is obtained in step S55, the control flow goes to step S57 to cancel the notice of the component shortage. That is, even when the component shortage has been once noticed as a result of the negative judgment (NO) in step S55, the positive judgment (YES) can be obtained in step S55 if the feeder 58 is replenished with the LEDs 122 having the same brightness level as the LEDs 122 whose shortage has been noticed, so that the notice of the component shortage is canceled in step S57.

Step S56 or S57 is followed by step S58 in which all the LEDs 122 remaining in the currently supplying feeder 58 are mounted onto the substrate piece 124. Then, after all the LEDs 122 remaining in the feeder 58 have been mounted onto the substrate piece 124, step S59 is implemented. In this step S59, the LEDs 122 are taken from the succeeding feeder 58 (In this instance, "SLOT NUMBER" is changed in the sequence table of FIG. 12.), so as to be mounted onto the substrate piece 124, and the manufacturing record correlating between the number of the substrate piece 124 and the brightness level is stored. By implementation of step S58, even in case of the negative judgment (NO) in step S51, it is possible to avoid the feeder 58 from being uninstalled from the mounting module 10, with the LEDs 122 (whose number is smaller than the above-described sum of the required number N and the additional number) being left in the feeder 58. That is, it is possible to waste the LEDs 122. On the other hand, when a negative judgment (NO) is obtained in step S54, the control flow goes to step S60. In this step S60, the LEDs 122, whose brightness level is different from the previously installed LEDs 122, are mounted onto the substrate piece 124, and the manufacturing record is stored. In this step S59, too, the "SLOT NUMBER" is changed in the sequence table.

Further, when a negative judgment (NO) is obtained in step S53, namely, when there is not another feeder 58 (other than the currently operated feeder 58) installed on the mounting module 10 and operable to supply the LEDs 122, step S61 is implemented to inform that the mounting module 10 should be replenished with new LEDs 122, namely, to inform that a new feeder 58 should be installed onto the mounting module 10. In the present embodiment, this information is provided on a display of the host computer 8 and also on a display of the mounting module 10 that is to be replenished with new LEDs 122. The display of each of the host computer 8 and the mounting module 10 serves as an indicator as an informing device. When new LEDs 122 have been installed onto the mounting module 10 in conformity with the information, a positive judgment (YES) is obtained in step S62, and then step S63 is implemented to judge whether or not the newly installed LEDs 122 have the same brightness level as that of the previously installed LEDs 122. When a positive judgment (YES) is obtained in step S63, the control flow goes to steps S64 and S65 that are implemented in the same manner as the above-described steps S58 and S59. Specifically described, in step S64, all the LEDs 122 remaining in the currently supplying feeder 58 are mounted onto the substrate piece 124. Then, in step S65, the LEDs 122 are taken from the succeeding feeder 56 so as to be mounted onto the substrate piece 124, and the manufacturing record correlating between the number of the substrate piece 124 and the brightness level is stared. On the other hand, when a negative judgment (NO) is obtained in step S63, the control flow goes to step S60 in which the LEDs 122 supplied from the succeeding feeder 56 are mounted, onto the substrate piece 124, and the manufacturing record is stored. The replenishment of the mounting module 10 with the LEDs 122 is detectable by detection of the installment of the feeder 58 into a vacant one of the holding portions 156. In this instance, the different-property-component-related information of the newly installed LEDs 122 is detected, and the detected different-property-component-related information is used for changing the "SLOT NUMBER" of the sequence table. It is noted that the install position of the empty feeder 58 (in which no LED 122 remains) may be informed, so that the empty feeder 58 can be removed from the install position and the succeeding feeder 58 can be installed in the install position, in a response to the information.

Where the LEDs 122 supplied from the plurality of feeders 58 installed on the mounting module 10 (that is assigned to mount the LEDs 122 onto a plurality of substrate pieces 124) do not have the same brightness level, each of the LEDs 122 is mounted onto a selected one of the plurality of substrate pieces 124, which is selected depending on the brightness level of the mounted LED 122. In the present embodiment, the brightness level is changed when the "SLOT NUMBER" is added into the sequence table, so that the LEDs 122 of the plurality of kinds supplied from the plurality of feeders 58 can be mounted onto the multi-piece substrate 120 in the mounting module 10 as a single electronic-circuit-component mounter.

After step S52, S59, S60 or S65 has been implemented, step S66 is implemented to judge whether the mounting work that is to be carried out in the mounting module 10 has been completed or not. When a negative judgment (NO) is obtained in step S66, the control flow goes back to step S51. When a positive judgment (YES) is obtained in step S66, the control flow goes to step S67 that is implemented to supply the manufacturing record information to the host computer 8. The supplied manufacturing record information corresponds to a combination of the data stored in steps S52, S59, S60, S65 and correlating between the number of each substrate piece 124 and the corresponding brightness level, and other data indicative of, for example, identification codes of the suction nozzle 86*b* and feeder 58 having committed failure in the component mounting.

Thereafter, in step S68, it is judged whether the scheduled manufacturing has been completed or not. When the scheduled manufacturing has not yet been completed, the control flow goes to step S69 that is implemented to carry out procedures such as loading and unloading of the multi-piece substrate 120, so as to prepare for the next mounting work. Then, the control flow goes back to step S51. When the scheduled manufacturing has been completed, the control flow goes to step S70 that is implemented to shut down the process whereby the execution of the program is terminated.

When the mounting of the LEDs 122 onto the multi-piece substrate 120 as a single circuit board has been completely performed by operations of the plurality of mounting modules 10, a substrate-piece information including the brightness level is printed by the printing module 10 in step S49 in the flow of FIG. 11. The multi-piece substrate 120 transferred into the printing module 10 is held by the circuit-board holding device 22 in the same manner as when the electronic circuit components have been mounted onto the substrate 120 in the mounting work. The printing head 170 is moved by the head moving device 62 so as to be positioned sequentially in a plurality of positions which are located on a horizontal plane and which are opposed to the respective barcode print areas 196 of the respective substrate pieces 124, so as to print the barcodes in the respective barcode print areas 196, whereby the brightness levels (as the property-related information) are provided to be correlated with the respective mount-position groups within the circuit board. The printing head 170 is first moved to an initial position which is aligned with an end portion, in the X-axis direction, of the barcode print area 196, and which is so close to an upper surface of the substrate piece 124 that the barcode can be printed on the upper surface by ejection of ink droplets from the printing head 170. Then, the printing head 170 is moved relative to the substrate piece 124 in the X-axis direction while being operated to eject the ink droplets toward the barcode print area 196, so as to print the barcode (representing the substrate-piece information) onto the barcode print area 196. The substrate-piece information includes at least the brightness level of the LEDs 122, and can be obtained from the manufacturing record information which is stored in steps S52, S59, S60, S65 and which includes data correlating between the number of each substrate piece 124 and the brightness level of the LEDs 122 mounted on the substrate piece 124. In the present embodiment, the manufacturing record information is supplied to the host computer 8 from the module controller 108 of the mounting module 10 that is assigned to mount the LEDs 122 onto the substrate piece 124, and is then supplied from the host computer 8 to the module controller 108 of the printing module 10.

After the barcodes have been printed onto the barcode print areas 196 of all the substrate pieces, the barcode reader 180 provided in the printing head 170 is moved sequentially to positions above the printed barcodes and is operated to read the informations recorded in the barcodes. Then, each of the read informations, i.e., informations actually recorded on the respective barcode print areas 196, is compared with the information supplied from the host computer 8, so as to confirm if the barcodes have been printed in conformity with the supplied information. This confirmation makes it possible to reliably avoid the subsequent procedures from being carried out for the substrate piece 124 onto which the information different from the supplied information has been recorded. However, the confirmation does not necessarily have to be done by reading the printed barcodes. When the recorded information matches with the supplied information, the recorded information is transmitted from the module controller 108 of the printing module 10 to the module controller 108 of the downstream-most mounting module 10 via the host computer 8 or without via the host computer 8. When the recorded information mismatches with the supplied information, this fact is indicated on the displays of the printing module 10 and the host computer 8 whereby the operator is informed of occurrence of the failure. In this case, the multi-piece substrate 120 is not transferred to the downstream-most mounting module 10, and the operator is awaited to take the multi-piece substrate 120 out from the printing module 10, in a response to the failure information.

In the downstream-most mounting module 10, at least one of the resistors 190 is mounted onto each of M pieces of the substrate pieces 124 of the multi-piece substrate 120 having barcodes printed thereon. In the host computer 8, the resistance value for each of the substrate pieces 124 is calculated based on the manufacturing record information, i.e., the brightness level of the LEDs 122 mounted on the substrate piece 124, such that the brightnesses of the M pieces of the substrate pieces 124 are equal to one another. Then, the host computer 8 calculates a resistor mounting data for obtaining the calculated resistance value in each of the substrate pieces 124. The resistor mounting data represents a required construction of the resistor circuit 200 in each of the substrate pieces 124, such as the number and kind of the resistors 190 (that are to be provided in the resistor circuit 200) and mount (i.e., connection) positions of the resistors 190 (in which the resistors 190 are to be positioned in the resistor circuit 200). Where any one of the available resistors 190 does not have a resistance value equal to the calculated or required resistance value, the resistor circuit 200 may be constructed to include at last one series-circuit section (in which the resistors 190 are connected in series with each other) and/or at least one parallel-circuit section (in which the resistors 190 are connected in parallel with each other), so that it is possible to obtain the required resistance value in the resistor circuit 200 as a whole, which is different from the resistance value inherent to each resistor 190. In this sense, the resistor mounting data may be interpreted to represent a combination of the resistors 190 (such as least one series-circuit section, at least one parallel-circuit section and a combination thereof) that is to be established in the resistor circuit 200. It is therefore possible to establish any one of various resistance values in the resistor circuit 200, even if a few kinds of resistors 190 are available to the user. The created resistor mounting data is transmitted from the host computer 8 to the module controller 108 of the mounting module 10 that is assigned to mount the resistors 190 onto the multi-piece substrate 120. It is noted that the resistor mounting data does not have to be created necessarily in the host computer 8 but may be created in the module controller 108. Further, the resistor mounting data may be created in a computer other than the host computer 8 and the module controller 108, such that the created resistor mounting data is transmitted to the module controller 108.

In the mounting module 10 assigned to mount onto the resistors 190 onto the multi-piece substrate 120, in general, the feeders 58 holding the resistors 190 projected to be mount onto the multi-piece substrate 120, are installed on the holding base 150, so that the resistors 190 are mounted onto the multi-piece substrate 120, in accordance with the resistor mounting data supplied from the host computer 8. Prior to the mounting of the resistors 190 onto the multi-piece substrate 120, it is checked whether or not the feeders 58 holding the resistors 190 of the required kinds are installed on the holding base 150. If some of the feeders 58 is not installed on the holding base 150, the operator is informed of shortage of the resistors 190 and kind of the resistors 190 in shortage. Then, the mounting of the resistors 190 is started after the installation of the feeders 58 (i.e., the installation of the resistors 190) has been completed. It may be checked, upon preparation of the resistor mounting data, whether or not the resistors 190 required for obtaining the desired resistance value are installed on the holding base 150, so that the required resistors 190 can be assuredly installed on the holding base 150, by informing, in case in which the required resistors 190 are not yet installed on the holding base 150, the operator of this fact.

In the resistor circuit 200, there is mounted at least one resistor 190 that is dependent on the brightness level of the substrate piece 124. For example, in case of FIG. 10A for establishing the resistor circuit 200 in the form of a circuit (see (a1) of FIG. 10A) including a parallel-circuit section and a series-circuit section, the resistors 190 are disposed as shown in (a2) of FIG. 10A. In case of FIG. 10B for establishing the resistor circuit 200 in the form of a circuit (see (b1) of FIG. 10B) including only a series-circuit section, the resistors 190 are disposed as shown in (b2) of FIG. 10B. In case of FIG. 10C for establishing the resistor circuit 200 in the form of a circuit (see (c1) of FIG. 10C) including two parallel-circuit sections, the resistors 190 are disposed as shown in (c2) of FIG. 10C. In case of FIG. 10D for establishing the resistor circuit 200 in the form of a circuit (see (d1) of FIG. 10D) including one parallel-circuit section, a jumper 220 as well as the resistors 190 is disposed as shown in (d2) of FIG. 10D, such that the jumper 220 establishes connection between connection terminals between which the resistor 190 is not disposed. After the resistors 190 have been mounted onto all the substrate pieces 124, the circuit board 57 (i.e., multi-piece substrate 120) i transferred to the reflow furnace 6.

As is clear from the above descriptions, in the present embodiment, among the eight mounting modules 10 cooperating with one another to constitute the mounter line 5, six mounting modules 10 are assigned to mount the LEDs 122 onto the multi-piece substrate 120. A portion of the module controller 108 of each of the six mounting modules 10, which is assigned to implement step S45, constitutes a different-property-component-related information detecting portion as a different-property-component-related information obtaining portion. A portion of the module controller 108 of each of the six mounting modules 10, which is assigned to implement step S48 for mounting the LEDs 122 onto the multi-piece substrate 120, constitutes a mounting controlling portion. The memory of the computer of the controller 108 of each of the six mounting modules 10, which is assigned to store therein the feeder/LED correlation table, constitutes memory means. Among the eight mounting modules 10, one mounting module 10 is assigned to print the barcodes onto the multi-piece substrate 120, and a portion of the module controller 108 of the mounting module 10 assigned to print the barcodes, which is assigned to implement step S49, constitutes a property-related information providing portion. Among the eight mounting modules 10, one mounting module 10 is assigned to read the barcodes, and a portion of the module controller 108 of the mounting module 10 assigned to read the barcodes, which is assigned to read the barcodes, constitutes a property-related information reading portion as a property-related information recognizing portion. Among the eight mounting modules 10, one mounting module 10 is assigned to mount the resistors 190 onto the multi-piece substrate 120, and a portion of the module controller 108 of the mounting module 10 assigned to mount the resistors 190, which is assigned to implement step S50, constitutes an associated component mounting controlling portion.

The printing of the barcodes (each representing the information including the brightness level of the LEDs 122 mounted on the substrate piece 124) and the mounting of the resistors 190 (carried out in view of the brightness level) are also parts of the electronic-circuit assembling process. The manufacturing record information cooperates with the basic backlight-assembling control program to constitute the particular backlight assembling control program. It is also possible to interpret that the manufacturing record information includes a correlation table correlating among the substrate ID, substrate piece number and brightness level, and that a combination of this correlation table cooperates and the basic backlight-assembling control program is used in assembly of the electronic circuit.

Figure 16:
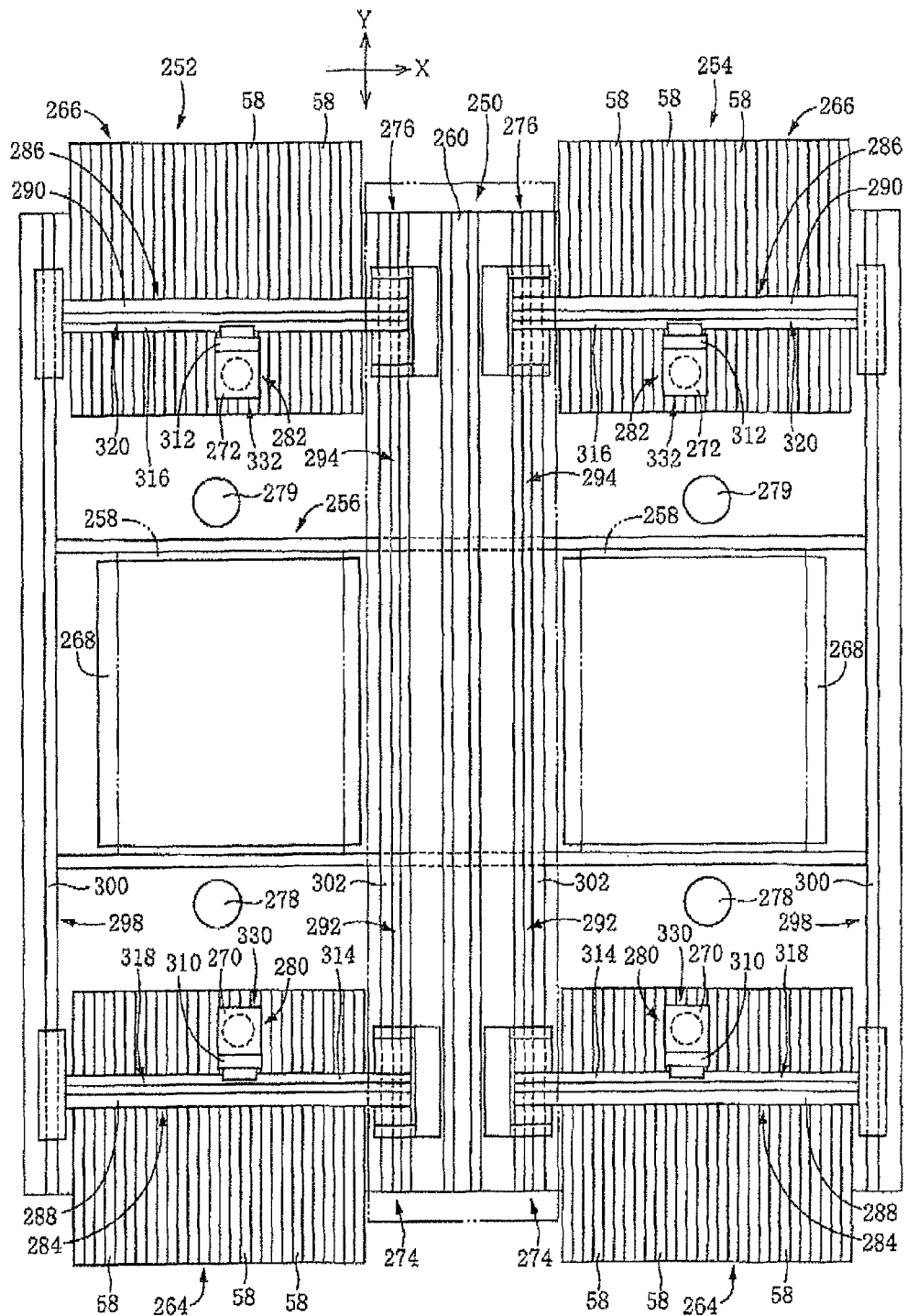
FIG. 16 is a view showing an external appearance of an electronic-circuit assembling system according to another embodiment of the invention.

The electronic-circuit assembling system may be a system including at least one electronic-circuit-component mounter that has a plurality of mounting devices. FIG. 16 shows an embodiment of such an electronic-circuit assembling system.

Although the electronic-circuit-component mounter included in, the system according to this embodiment is not yet publically disclosed, this electronic-circuit-component mounter will be described since it has a construction similar to that of an electronic-circuit-component mounter described in description of JP-2009-010319A, the assignee of which is the same assignee of the present application. In the following descriptions, the electronic-circuit-component mounter will be described, and the other component apparatuses will not be described since having substantially the same constructions as those of the electronic-circuit assembling system of the above-described embodiment.

The electronic-circuit-component mounter has a mounter main body 250 and a pair of component mounting portions 252, 254, as shown in FIG. 16. In the present embodiment, the component mounting portions 252, 254 are arranged in a circuit-board conveyance direction in which circuit boards 258 are to be conveyed by a circuit-board conveying device 256 on a horizontal plane. The component mounting portions 252, 254 are symmetrical to each other with respect to a direction perpendicular to the circuit-board conveyance direction. The circuit-board conveying device 256 is constituted by, for example, a belt conveyor as a kind of conveyor, and is disposed on a base 260 of the mounter main body 250, so as to bridge between the component mounting portions 252, 254.

The component mounting portions 252, 254 are identical in contraction with each other, so that the component mounting portion 254, which is one of the mounting portions 252, 254 that is located on a downstream side of the other of the mounting portions 252, 254, will be described as a representative one of the mounting portions 252, 254.

The component mounting portion 254 includes a pair of component supplying devices 264, 266, a circuit-board holding device 268, a pair of mounting heads 270, 272, a pair of head moving devices 274, 276, a pair of component-image taking devices 278, 279 and a pair of fiducial-mark-image taking device (not shown). The component supplying devices 264, 266 are disposed on respective opposite sides of the circuit-board conveying device 256 in the Y-axis direction. Since each of the component supplying devices 264, 266 has a construction similar to that of the above-described component supplying device 24, the same reference signs as used in the above-described embodiment will be used to identify the functionally corresponding elements, and redundant description of these elements is not provided. Further, since the circuit-board holding device 268 has a construction similar to that of the above-described circuit-board holding device 22, description of the holding device 268 is not provided.

The mounting heads 270, 272 and the head moving devices 274, 276 will be described.

Each of the head moving devices 274, 276 has a corresponding one of X-axis direction moving devices 280, 282 and a corresponding one of Y-axis direction moving devices 284, 286. Each of the Y-axis direction moving devices 284, 286 has a movable member in the form of a corresponding one of Y-axis slides 288, 290 and a movable-member moving device in the form of a corresponding one of linear motors 292, 294. Each of the Y-axis slides 288, 290 has a shape elongated in the X-direction, and is guided at its longitudinally opposite end portions by respective guide rails 300, 302 of a guiding device 298, so as to be movable and positionable in a randomly selected position in the Y-axis direction.

Each of the X-axis direction moving devices 280, 282 is disposed on a corresponding one of the Y-axis slides 288, 290, and includes a movable member in the form of a corresponding one of X-axis slides 310, 312 and an X-axis-slide moving device (not shown). The X-axis-slide moving device includes a servo motor as a drive source and also a ball-screw mechanism (not shown). Each of the X-axis slides 310, 312 is guided by a corresponding one of guiding devices 318, 320 that include respective pairs of guide rails 314, 316. Each of the pairs of guide rails 314, 316 consists of upper and lower guide rails. In FIG. 16, the upper guide rail is shown while the lower guide rail is not shown. Each of the X-axis slides 310, 312 guided by a corresponding one of the guiding devices 318, 320 is movable and positionable in a randomly selected position in the X-axis direction on a corresponding one of the Y-axis slides 288, 290.

Each of the mounting heads 270, 272 is disposed on a corresponding one of the X-axis slides 310, 312, and is movable on a horizontal plane so as to be positionable in a randomly selected position within an area between the circuit-board holding device 268 and a corresponding one of the two component supplying devices 264, 266 which is located on the side of the mounting head 270 or 272. In the present embodiment, each of the mounting head 270, 272 is detachably attached to a corresponding one of the X-axis slides 310, 312, by means of an attachment mechanism that has substantially the same construction as the above-described attachment mechanism by which the above-described mounting head 60 is detachably attached to the second X-axis slide 76. Each of the mounting heads 270, 272 has substantially the same construction as the mounting head 60, and may be of various kinds different from each other with respect to number of nozzle holders. Further, the fiducial-mark-image taking devices (not shown) are disposed on the respective X-axis slides 310, 312.

Each of the mounting heads 270, 272 cooperates with a corresponding one of the head moving devices 274, 276 to constitute a corresponding one of mounting devices mounting devices 330, 332. Thus, the electronic-circuit-component mounter has a total of four mounting devices, such that two of the four mounting devices are provided in the component mounting portion 252 while other two of the four mounting devices are provided in the component mounting portion 254. In the present embodiment, LEDs are mounted onto substrate pieces by the mounting device 330 as one of the mounting devices 330, 332 of the component mounting portion 252 that is located on an upstream side of the component mounting portion 254, the feeders 58 holding the LEDs are installed on a feeder holding base in the component supplying device 264 of the component mounting portion 252, and the barcodes are printed onto the substrate pieces by the printing head which is, in place of the mounting head 272, held by the X-axis slide 312 of the mounting device 332 as the other of the mounting devices 330, 332 of the component mounting portion 252. The printing head has substantially the same construction as the above-described printing head 170, but does not have a barcode reader unlike the printing head 170. Further, in the present embodiment, the barcodes printed on the substrate pieces are read by a reading head which is, in place of the mounting head 270, held by the X-axis slide 312 of the mounting device 330 as one of the mounting devices 330, 332 of the component mounting portion 254 that is located on a downstream side of the component mounting portion 256, the feeders 58 holding the resistors are installed on a feeder holding base in the component supplying device 266 of the component mounting portion 254, and the resistors are mounted onto the substrate pieces by the mounting device 332 as the other of the mounting devices 330, 332 of the component mounting portion 254. The reading head has a head main body and a barcode reader.

The mounting devices 330, 332 of the component mounting portion 252 and the mounting devices 330, 332 of the component mounting portion 254 are controllable by respective four computers constituting control devices (not shown) that are connected to the host computer.

In the electronic-circuit assembling system including the electronic-circuit-component mounter having the pair of component mounting portions 252, 254, too, the operation flow as shown in FIG. 11 is carried out, whereby the LEDs and the resistors are installed onto the component mounting portions 252, 254, and LEDs and the resistors are mounted onto the substrate pieces. The LEDs are mounted onto all the substrate pieces of a single multi-piece substrate by operation of the mounting device 330 of the component mounting portion 252, and then the barcodes are printed onto the substrate pieces by operation of the printing head moved by the head moving device 276. In the present embodiment, the information (such as the brightness level of the LEDs), which are to be printed onto the substrate pieces, are obtained from the manufacturing record information supplied to the computer configured to control the mounting head 272 serving as the printing head from the computer configured to control the mounting head 270.

After printing of the barcodes onto the substrate pieces, the multi-piece substrate is transferred to the component mounting portion 254 that is located on the downstream side of the component mounting portion 252, and is held by the circuit-board holding device 268 of the component mounting portion 254. Then, in the component mounting portion 254, the reading head is moved by the head moving device 272, such that the barcodes printed on the substrate pieces are read by the barcode reader of the reading head. The resistor mounting data is created based on the brightness level of the LEDs that has been obtained from the read barcodes. Then, in the component mounting portion 254, the mounting head 272 of the mounting device 332 is moved, so as to take resistors from the component supplying device 266 and mount the resistors onto the substrate pieces. The resistor mounting data may be created either in the computer configured to control the mounting head 270 of the component mounting portions 254 or in the computer configured to control the reading head (i.e., mounting head 272) of the component mounting portions 254. In the former case, the resistor mounting data created by the computer configured to control the mounting head 270 is transmitted to the computer configured to control the reading head. In the latter case, the information obtained from the read barcodes is transmitted to the computer configured to control the reading head so that the resistor mounting data can be created therein.

The two component mounting portions 252, 254 shown in FIG. 16 may be interpreted to constitute the respective electronic-circuit-component mounters. According to this interpretation, one of the plurality of electronic-circuit-component mounters of the electronic-circuit assembling system is assigned to mount the different-property components onto the circuit board and to provide the circuit board with the property-related information, while another one of the plurality of electronic-circuit-component mounters is assigned to recognize the property-related information and to mount the associated components onto the circuit board. Further, it is possible to interpret that the plurality of electronic-circuit-component mounters each having the plurality of mounting devices constitute the mounter line.

in the above-described embodiments, the multi-piece substrate is conveyed in the electronic-circuit-component mounter while taking the posture that causes the longitudinal direction of the substrate pieces to be parallel to the conveyance direction. However, the multi-piece substrate may be conveyed while taking the posture that causes the longitudinal direction of the substrate pieces to be perpendicular to the conveyance direction.

Further, where each one of the plurality of electronic-circuit-component mounters, which cooperate with each other to constitute the mounter line, is assigned to a corresponding part of the mounting work for the different-property components onto a single multi-piece substrate, each one of the electronic-circuit-component mounters does not necessarily have to be assigned to mount the different-property components onto an entirety of one of the substrate pieces of the single multi-piece substrate, but may be assigned to mount the different-property components onto at least a part of one of the substrate pieces.

In the mounter line 5 of the electronic-circuit assembling system according to the embodiment shown in FIGS. 1-15, it is possible to mount the different-property components onto a large-sized circuit board whose size as measured in the conveyance direction is larger than a size of each one of the mounting modules 10 as measured in the conveyance direction. In this case, the large-sized circuit board may be positioned over two or more of the mounting modules 10 so as to held by the circuit-board holding devices 22 of the respective two or more mounting modules 10. The different-property components can be mounted onto a portion of the circuit board which is located at a boundary between two adjacent mounting modules 10, by enabling the mounting head 80 to be reach this portion of the circuit board, with movement of the second X-axis slide 76 on the first X-axis slide 74 in the X-axis direction.

Further, in the mounter line, the property-related information may be provided on a back surface of the circuit board which is opposite to the mount surface of the circuit board onto which the different-property components are mounted. In this case, for example, the property-related-information providing head may be positioned on a side of the back surface so as to provide the back surface of the circuit board with the property-related information. Alternatively, a board inverting device may be incorporated into the mounter line, so as to be disposed on a downstream side of the electronic-circuit-component mounters that are assigned to mount the different-property components onto the circuit board. In this alternative arrangement, the circuit board is inverted by the board inverting device so as to cause the back surface as an information receiving surface to be face upwardly, and the inverted circuit board is transferred to the property-related information provider that is constituted by one of the electronic-circuit-component mounters which is located on a downstream side of the board inverting device, such that the property-related information is provided on the upwardly facing back surface of the inverted circuit board by operation of the property-related-information providing head. Moreover, as another alternative means, a property-related information provider, which is capable of providing the property-related information onto the back surface of the circuit board without necessity of inverting the circuit board, may be disposed on a downstream side of the electronic-circuit-component mounters that are assigned to mount the components onto the circuit board. Where the associated components are to be mounted onto the back surface of the circuit board, too, the board inverting device may be disposed in midway of the mounter line, such that the circuit board is inverted by the board inverting device after the different-property components have been mounted onto the circuit board, and the associated components are mounted onto the back surface of the circuit board within the mounter line.

Further, in the mounter line, the mounting of the different-property component onto the circuit board and the provision of the property-related information onto the circuit board may be carried out therein, while the recognition of the information provided on the circuit board and the mounting of the associated components onto the circuit board may be carried out by a single electronic-circuit-component mounter or two electronic-circuit-component mounters that are provided apart from the mounter line, or a property-related information recognizes and an electronic-circuit-component mounter that are provided apart from the mounter line. Further, alternatively, after having been provided with the information, the circuit board may be inputted again into the mounter line. Where the recognition of the information and the mounting of the associated components are carried out in a single working apparatus provided apart from the mounter line, a control device, which is provided for controlling the mounting of the associated components, may be configured to recognize the property-related information provided on the circuit board and then to mount, onto the circuit board, the associated components that are selected based on the recognized property-related information.

Further, as a part of the previous preparation, registration of the LEDs that are to be used for the manufacturing may be carried out. Specifically, the registration of the LEDs can be made by registering the initial component amount that is the number of the LEDs initially stored in each of the reels (that are to be used) and also the correlation between the reel identification code of each reel and the brightness level of the LEDs stored in the reel. Data indicative of the registered LEDs may be transmitted from a personal computer to the host computer, or may be inputted directly into the host computer. Further, the data indicative of the registered LEDs may be transmitted from the host computer to each of the component apparatuses of the assembling system.

Further, where ICs as well as the different-property components are disposed on a surface of the circuit board so that the surface does not have a space available for the provision of the property-related information, for example, the property-related information may be provided or printed onto an upper surface of IC disposed on the circuit board. This arrangement makes it possible to provide the circuit board with the property-related information without having to unnecessarily increase the size of the circuit board. Further, the property-related information may be provided on an upper surface of a chip of the IC.

The control device of the electronic-circuit-component mounter may be constructed to include a single computer or a plurality of computers that are connected to each other.

In the above-described embodiments, only the LEDs 122 having the same brightness level are mounted onto each one of the substrate piece 124. However, the brightness of the substrate piece 124 can be uniform over its entirety, also by an arrangement in which the LEDs 122 of first group and the LEDs 122 of second group are arranged alternately to each other (such that each adjacent two LEDs 122 consist of one of the LEDs 122 of the first group and one of the LEDs 122 of the second group), wherein the LEDs 122 of first group have the respective brightness levels which are the same to each other and which are different from the brightness levels of the LEDs 122 of the second group.

In the electronic-circuit assembling system according to the embodiment shown in FIGS. 1-15, when the amount of the components (i.e., amount of the LEDs 122 having the same brightness level) stored in all the feeders 58 installed on the mounting module 10 (as a single electronic-circuit-component mounter) becomes smaller than the above-described predetermined number P, the shortage of the components is pre-noticed, for thereby advantageously avoiding operation of the mounting module 10 from being obligatorily stopped upon occurrence of actual shortage of the components. This arrangement may be modified such that, each time when supply of the LEDs 122 from each feeder 58 is completed, this completion may be informed to the operator, in addition to or in place of the pre-notice of the possible shortage of the components, so that the vacant feeder 58 can be quickly replaced with a new feeder 58 by the operator.

Further, only one feeder 58 rather than a plurality of feeders 58 may be constantly installed on the mounting module 10 (as a single electronic-circuit-component mounter), with an arrangement causing the feeder 58 to be replaced with a new feeder 58 each time when the amount of the LEDs 122 remaining in the installed feeder 58 becomes smaller than a required number for completing the mounting of the LEDs 122 onto the entirety of the substrate piece 124.

It is noted that the above modifications may be applied to the embodiment shown in FIG. 16.

In the embodiment shown in FIGS. 1-15, when it becomes impossible to complete the mounting of the components onto the entirety of the substrate piece 124, by supply of only the LEDs 122 remaining in the currently supplying feeder 58, it is judged whether there is another feeder 58 which is already installed on the same mounting module 10 and which is ready for supplying the LEDs 122 having the same brightness level as the currently supplied LEDs 122. However, this arrangement may be modified such that it is judged whether there is another feeder 58 which is already installed on not only the same mounting module 10 but also another mounting module 10 and which is ready for supplying the LEDs 122 having the unchanged brightness level. In this modified arrangement, after the LEDs 122 supplied from the feeder 58 installed on the same mounting module 10 have been mounted onto the substrate piece 124, the LEDs 122 supplied from the feeder 58 installed on the other mounting module 10 may be mounted onto the substrate piece 124, for completing the mounting of the components onto the entirety of the substrate piece 124.

Further, in each of the above-described embodiments, the single substrate ID is provided onto the entirety of the multi-piece substrate 120. However, where the manufacturing record is used even after the multi-piece substrate 120 has been divided into the substrate pieces 124, for example, it is desirable that the substrate ID is provided onto each one of the substrate pieces 124.

Still further, in each of the above-described embodiments, the brightness level of the LEDs 122 is made uniform over the entirety of each one of the substrate pieces 124. However, the brightness level of the LEDs 122 may be made uniform over the entirety of the multi-piece substrate 120 or entirety of an ordinary substrate (that is other than a multi-piece substrate). In this case, the mounting work may be carried out, with the multi-piece substrate 120 or the ordinary substrate being handled as if being each one of the substrate pieces 124. In this modified arrangement, too, the electronic circuit components of the same kind may be installed on two or more of the mounting modules 10 constituting the mounter line 5 of the electronic-circuit assembling system, so that the two or more mounting modules 10 cooperate with each other to mount the electronic circuit components of the same kind onto the entirety of the multi-piece substrate 120 or entirety of the ordinary substrate.

What is claimed is:

1. An electronic-circuit assembling process for assembling an electronic circuit using an electronic-circuit assembling system, a plurality of electronic circuit components supplied from at least one component supplier of a component supplying device being mounted onto a circuit board supported by a board supporting device, the plurality of electronic circuit components includes different-property components having respective electrical properties such that the electrical properties of at least two of the different-property components are different from each other, and the different-property components being handled as if they had the same electrical properties in a control for controlling mounting of the electronic circuit components onto the circuit board, said electronic-circuit assembling process comprising:

determining a plurality of mount-position groups such that each one of the determined plurality of mount-position groups is constituted by a plurality of mount positions in which the different-property components are to mounted onto the circuit board;

obtaining a different-property-component-related information that includes: (a) a property-related information that enables recognition of the electrical property of each of the different-property components which is supplied from a corresponding one of the at least one component supplier, and (b) a different-property-component supply position that is a position of the corresponding one of the at least one component supplier which supplies the each of the different-property components, such that the different-property-component-related information is obtained by detecting at least one of the property-related information and the different-property-component supply position;

mounting, based on at least information related to the obtained different-property-component supply position, the plurality of electronic circuit components including the different-property components, onto the circuit board, such that the different-property components that are the same as each other with respect to electrical property value are mounted onto the respective mount position of each one of the plurality of mount-position groups; and providing the circuit board with the obtained property-related information of each of the different-property components that is mounted on the circuit board, such that the provided property-related information of each of the different-property components is correlated with a corresponding one of the plurality of mount-position groups.

2. The electronic-circuit assembling process according to claim 1, the electronic-circuit assembling system including an electronic-circuit-component mounter having a mounting device that is configured to mount the electronic circuit components onto the circuit board after taking the electronic circuit components from the component supplying device, and the component supplying device including: (i) a plurality of component suppliers as the at least one component supplier each of which is configured to store therein the plurality of electronic circuit components and to sequentially supply the plurality of electronic circuit components to the mounting device and (ii) a component-supplier holder having a plurality of holding portions configured to detachably hold the plurality of component suppliers, said electronic-circuit assembling process comprising:
causing at least one of the plurality of component suppliers to store therein the different-property components;
causing at least one of the plurality of holding portions to hold the at least one of the plurality of component suppliers storing therein the different-property components; and
causing the electronic-circuit-component mounter to automatically obtain (α) a position of the at least one of the plurality of holding portions holding the at least one of the plurality of component suppliers and (β) the property-related information of each of the different-property components that are supplied from the at least one of the plurality of component suppliers.

3. The electronic-circuit assembling process according to claim 1,
wherein the electronic-circuit assembling system including a mounter line formed of a plurality of electronic-circuit-component mounters that are arranged in a line, with each adjacent two of the arranged electronic-circuit-component mounters being close to each other without a gap that enables the circuit board to be taken out through the gap,
said electronic-circuit assembling process comprising:
causing at least one of the arranged electronic-circuit-component mounters to mount the at least one of the different-property components onto the circuit board;
causing at least one of the arranged electronic-circuit-component mounters to provide the circuit board with the property-related information of each of the at least one of the different-property components;
causing at least one of the arranged electronic-circuit-component mounters to recognize the property-related information provided in the circuit board; and
causing at least one of the arranged electronic-circuit-component mounters to mount, onto the circuit board, at least one of the electronic circuit components, which is determined to be associated with the at least one of the different-property components, on the basis of the recognition of the property-related information.

4. The electronic-circuit assembling process according to claim 1,
wherein the electronic-circuit assembling system including a plurality of electronic-circuit-component mounters,
said electronic-circuit assembling process comprising:
causing one of the electronic-circuit-component mounters to mount the at least one of the different-property components onto the circuit board;
causing the one of the electronic-circuit-component mounters to provide the circuit board with the property-related information of each of the at least one of the different-property components;
causing another one of the electronic-circuit-component mounters to recognize the property-related information provided in the circuit board; and
causing the another one of the electronic-circuit-component mounters to mount, onto the circuit board, at least one of the electronic circuit components, which is determined to be associated with the at least one of the different-property components, on the basis of the recognition of the property-related information.

5. The electronic-circuit assembling process according to claim 1,
wherein the electronic-circuit assembling system including a mounter line formed of a plurality of electronic-circuit-component mounters each having a mounting device,
said electronic-circuit assembling process comprising:
causing the mounting device of one of the plurality of electronic-circuit-component mounters to hold a property-related-information providing head configured to provide the circuit board with the property-related information, in place of a mounting head configured to mount the electronic circuit components on the circuit board,; and
causing the one of the plurality of electronic-circuit-component mounters to provide the circuit board with the property-related information.

6. The electronic-circuit assembling process according to claim 1, wherein
the electronic-circuit assembling system includes a mounting device having a mounting head that is configured to mount the electronic circuit components onto the circuit board after carrying the electronic circuit components from the component supplying device, and
the different-property components are handled as being components that are similar to each other, at least in a detection of an error of positioning each of the different-property components when each of the different-property components are carried by a component holder of the mounting head, such that the detection of the error is made by taking an image of the carried different-property component and comparing the taken image with similar reference data that is common to the different-property components.

7. The electronic-circuit assembling process according to claim 1, wherein the property-related information is provided on the circuit board, by providing, on the circuit board, a machine-readable representative indicative of the property-related information of each of the different-property components, so as to provide the circuit board with the property-related information of the each of different-property components.

8. The electronic-circuit assembling process according to claim 1,
wherein the circuit board is a multi-piece substrate that is formed by a plurality of substrates that are connected to each other,
wherein the plurality of mount positions of each one of the mount-position groups are located in a corresponding one of the substrates, and
wherein the multi-piece substrate as the circuit board is cut to separate the substrates from each other, after the plurality of electronic circuit components have been mounted onto the multi-piece substrate.

9. An electronic-circuit assembling process for assembling an electronic circuit by an electronic-circuit assembling system, a plurality of electronic circuit components supplied from at least one component supplier of a component supplying device being mounted onto a circuit board supported by a board supporting device, the plurality of electronic circuit components includes different-property components having respective electrical properties such that the electrical properties of at least two of the different-property components are different from each other, and the different-property components being handled as if they had the same electrical properties in a control for controlling mounting of the electronic circuit components onto the circuit board, said electronic-circuit assembling process comprising:

determining a plurality of mount-position groups such that each one of the determined plurality of mount-position groups is constituted by a plurality of mount positions in which the different-property components are to mounted onto the circuit board;

storing, in a memory, a component-supplier/different-property-component correlation-related information related to a correlation between a component-supplier-identification-related information and a property-related information, the component-supplier-identification-related information being related to an identification of each of the at least one component supplier which supplies at least one of the different-property components, the property-related information enabling recognition of the electrical property of each of the different-property components which is supplied from a corresponding one of the at least one component supplier;

detecting the component-supplier-identification-related information of each of the at least one component supplier installed on the electronic-circuit assembling system, such that the detected component-supplier-identification-related information is correlated with a component supply position that is a position of the installation of each of the at least one component supplier;

detecting a different-property-component-related information that includes: (a) a different-property-component supply position from which each of the different-property components is supplied by said component supplying device and (b) the property-related information of the each of the different-property components which is supplied by said component supplying device, based on the detected component-supplier-identification-related information and the component supply position of a corresponding one of the at least one component supplier, and based on the component-supplier/different-property-component correlation-related information stored in the memory;

mounting the plurality of electronic circuit components onto the circuit board, by supplying, based on at least information related to the different-property-component supply position obtained by detecting the different-property-component-related information, the plurality of electronic circuit components including the different-property components, from the at least one component supplier of the component supplying device, such that the different-property components that are the same as each other with respect to electrical property value are mounted onto the respective mount position of each one of the plurality of mount-position groups; and providing the circuit board with the obtained property-related information of each of the different-property components that are mounted on the circuit board, such that the provided property-related information of each of the different-property components is correlated with a corresponding one of the plurality of mount-position groups.

10. The electronic-circuit assembling process according to claim 9, wherein the electronic-circuit assembling system including an electronic-circuit-component mounter having a mounting device that is configured to mount the electronic circuit components onto the circuit board after taking the electronic circuit components from the component supplying device, and wherein the component supplying device includes: (i) the plurality of component suppliers as the at least one component supplier each of which is configured to store therein the plurality of electronic circuit components and to sequentially supply the plurality of electronic circuit components to the mounting device and (ii) a component-supplier holder having a plurality of holding portions configured to detachably hold the plurality of component suppliers, said electronic-circuit assembling process comprising:

causing at least one of the plurality of component suppliers to store therein the different-property components;

causing at least one of the plurality of holding portions to hold the at least one of the plurality of component suppliers storing therein the different-property components; and causing the electronic-circuit-component mounter to automatically obtain ($\alpha$) a position of the at least one of the plurality of holding portions holding the at least one of the plurality of component suppliers and ($\beta$) the property-related information of each of the different-property components that are supplied from the at least one of the plurality of component suppliers.

11. The electronic-circuit assembling process according to claim 9, wherein the electronic-circuit assembling system including a mounter line formed by a plurality of electronic-circuit-component mounters that are arranged in a line, with each adjacent two of the arranged electronic-circuit-component mounters being close to each other without a gap that enables the circuit board to be taken out through the gap, said electronic-circuit assembling process comprising:

causing at least one of the arranged electronic-circuit-component mounters to mount the at least one of the different-property components onto the circuit board;

causing at least one of the arranged electronic-circuit-component mounters to provide the circuit board with the property-related information of each of the at least one of the different-property components;

causing at least one of the arranged electronic-circuit-component mounters to recognize the property-related information provided in the circuit board; and causing at least one of the arranged electronic-circuit-component mounters to mount, onto the circuit board, at least one of the electronic circuit components, which is determined to be associated with the at least one of the different-property components, on the basis of the recognition of the property-related information.

12. The electronic-circuit assembling process according to claim 9, wherein the electronic-circuit assembling system including a plurality of electronic-circuit-component mounters, said electronic-circuit assembling process comprising:
causing one of the electronic-circuit-component mounters to mount the at least one of the different-property components onto the circuit board;
causing the one of the electronic-circuit-component mounters to provide the circuit board with the property-related information of each of the at least one of the different-property components;
causing another one of the electronic-circuit-component mounters to recognize the property-related information provided in the circuit board; and
causing the another one of the electronic-circuit-component mounters to mount, onto the circuit board, at least one of the electronic circuit components, which is determined to be associated with the at least one of the different-property components, on the basis of the recognition of the property-related information.

13. The electronic-circuit assembling process according to claim 9,
wherein the electronic-circuit assembling system including a mounter line formed of a plurality of electronic-circuit-component mounters each having a mounting device,
said electronic-circuit assembling process comprising:
causing the mounting device of one of the plurality of electronic-circuit-component mounters, to hold, in place of a mounting head configured to mount the electronic circuit components on the circuit board, a property-related-information providing head configured to provide the circuit board with the property-related information; and
causing the one of the plurality of electronic-circuit-component mounters to provide the circuit board with the property-related information.

14. The electronic-circuit assembling process according to claim 9, wherein
the electronic-circuit assembling system includes a mounting device having a mounting head that is configured to mount the electronic circuit components onto the circuit board after carrying the electronic circuit components from the component supplying device,
the different-property components being handled as components that are similar to each other, at least in a detection of an error of positioning each of the different-property components when each of the different-property components are carried by a component holder of the mounting head, such that the detection of the error is made by taking an image of the carried different-property component and comparing the taken image with similar reference data that is common to the different-property components.

15. The electronic-circuit assembling process according to claim 9, wherein the property-related information is provided on the circuit board, by providing, on the circuit board, a machine-readable representative indicative of the property-related information of each of the different-property components, so as to provide the circuit board with the property-related information of the each of different-property components.

16. The electronic-circuit assembling process according to claim 9,
wherein the circuit board is a multi-piece substrate that is formed by a plurality of substrates that are connected to each other,
wherein the plurality of mount positions of each one of the mount-position groups are located in a corresponding one of the substrates, and
wherein the multi-piece substrate as the circuit board is cut to separate the substrates from each other, after the plurality of electronic circuit components have been mounted onto the multi-piece substrate.

* * * * *